United States Patent
Fischer

(10) Patent No.: US 8,217,441 B2
(45) Date of Patent: Jul. 10, 2012

(54) SEMICONDUCTOR CONSTRUCTIONS INCLUDING GATE ARRAYS FORMED ON PARTIAL SOI SUBSTRATE

(75) Inventor: Mark Fischer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 541 days.

(21) Appl. No.: 12/186,726

(22) Filed: Aug. 6, 2008

(65) Prior Publication Data

US 2009/0194802 A1 Aug. 6, 2009

Related U.S. Application Data

(62) Division of application No. 11/436,726, filed on May 17, 2006, now Pat. No. 7,422,960.

(51) Int. Cl.
*H01L 27/108* (2006.01)
*H01L 21/94* (2006.01)
*H01L 21/336* (2006.01)

(52) U.S. Cl. .......... 257/311; 257/E29.13; 438/284

(58) Field of Classification Search ........... 257/311, 257/E29.13; 438/254, 284
See application file for complete search history.

(56) References Cited

U.S. PATENT DOCUMENTS

| | | | |
|---|---|---|---|
| 6,465,865 B1 * | 10/2002 | Gonzalez | 257/506 |
| 6,784,076 B2 | 8/2004 | Gonzalez et al. | |
| 7,319,252 B2 * | 1/2008 | Chang | 257/288 |
| 2002/0109155 A1 * | 8/2002 | Shin et al. | 257/202 |
| 2004/0108523 A1 * | 6/2004 | Chen et al. | 257/202 |
| 2004/0198003 A1 * | 10/2004 | Yeo et al. | 438/284 |
| 2005/0199932 A1 | 9/2005 | Abbott et al. | |
| 2005/0218438 A1 * | 10/2005 | Lindert et al. | 257/296 |
| 2005/0282342 A1 | 12/2005 | Adan | |
| 2006/0068591 A1 * | 3/2006 | Radosavljevic et al. | 438/689 |
| 2006/0172497 A1 * | 8/2006 | Hareland et al. | 438/286 |

OTHER PUBLICATIONS

K.H. Yeo, et al.; 80 n. 512M DRAM with Enhanced Data Retention Time Using Partially-Insulated Cell Array Transistor (PiCAT); 2004 Symposium on VLSI Technology Digest of Technology; 2004 IEEE; pp. 30-31.

* cited by examiner

*Primary Examiner* — Matthew Landau
*Assistant Examiner* — Daniel Luke
(74) *Attorney, Agent, or Firm* — Wells St. John.P.S.

(57) ABSTRACT

The invention includes methods for utilizing partial silicon-on-insulator (SOI) technology in combination with fin field effect transistor (finFET) technology to form transistors particularly suitable for utilization in dynamic random access memory (DRAM) arrays. The invention also includes DRAM arrays having low rates of refresh. Additionally, the invention includes semiconductor constructions containing transistors with horizontally-opposing source/drain regions and channel regions between the source/drain regions. The transistors can include gates that encircle at least three-fourths of at least portions of the channel regions, and in some aspects can include gates that encircle substantially an entirety of at least portions of the channel regions.

10 Claims, 26 Drawing Sheets

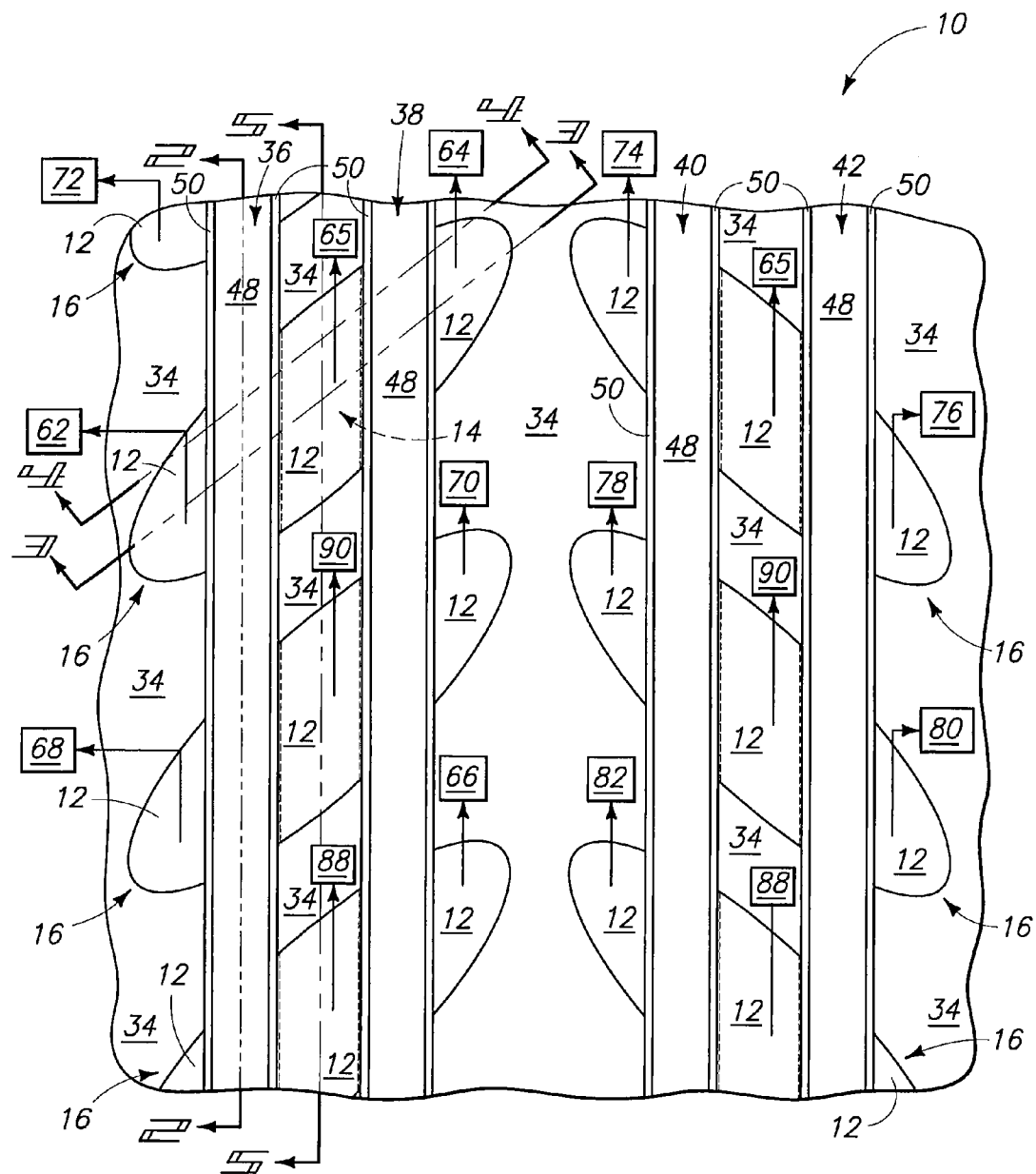
FIG. II

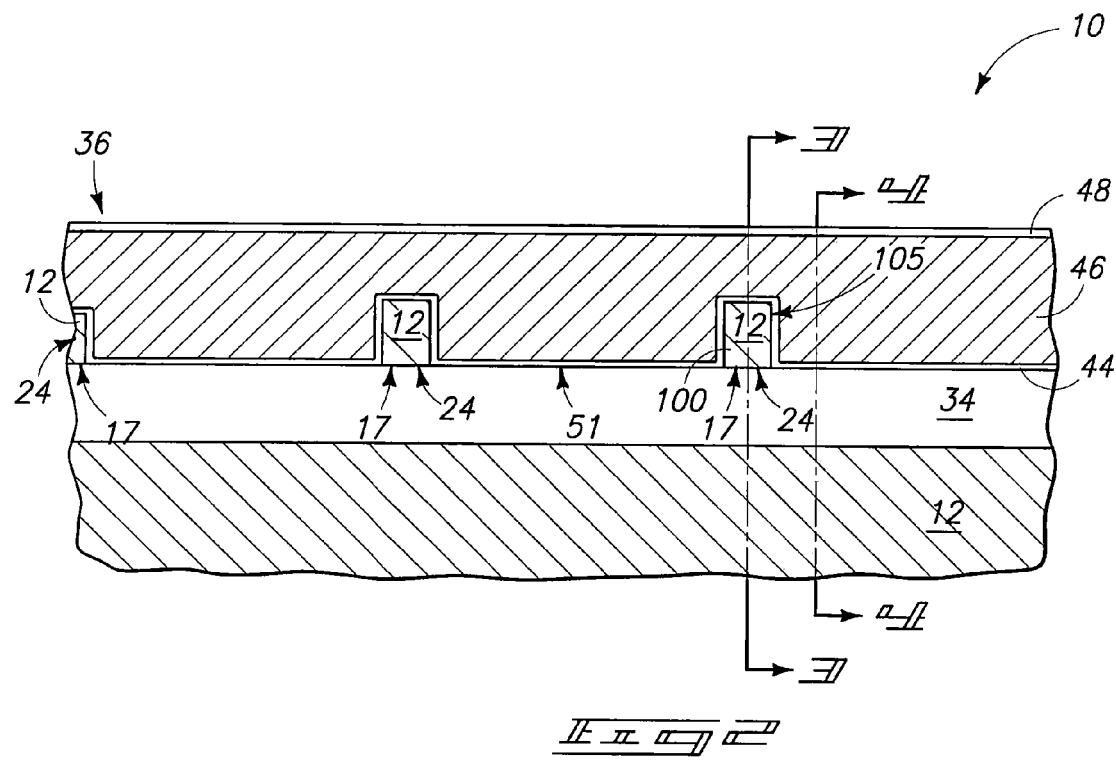
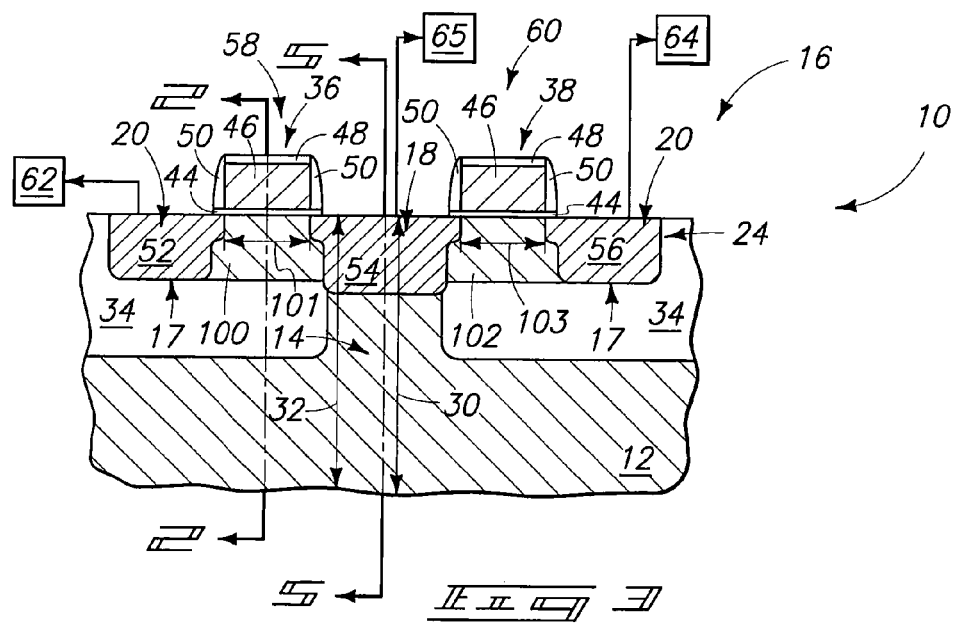

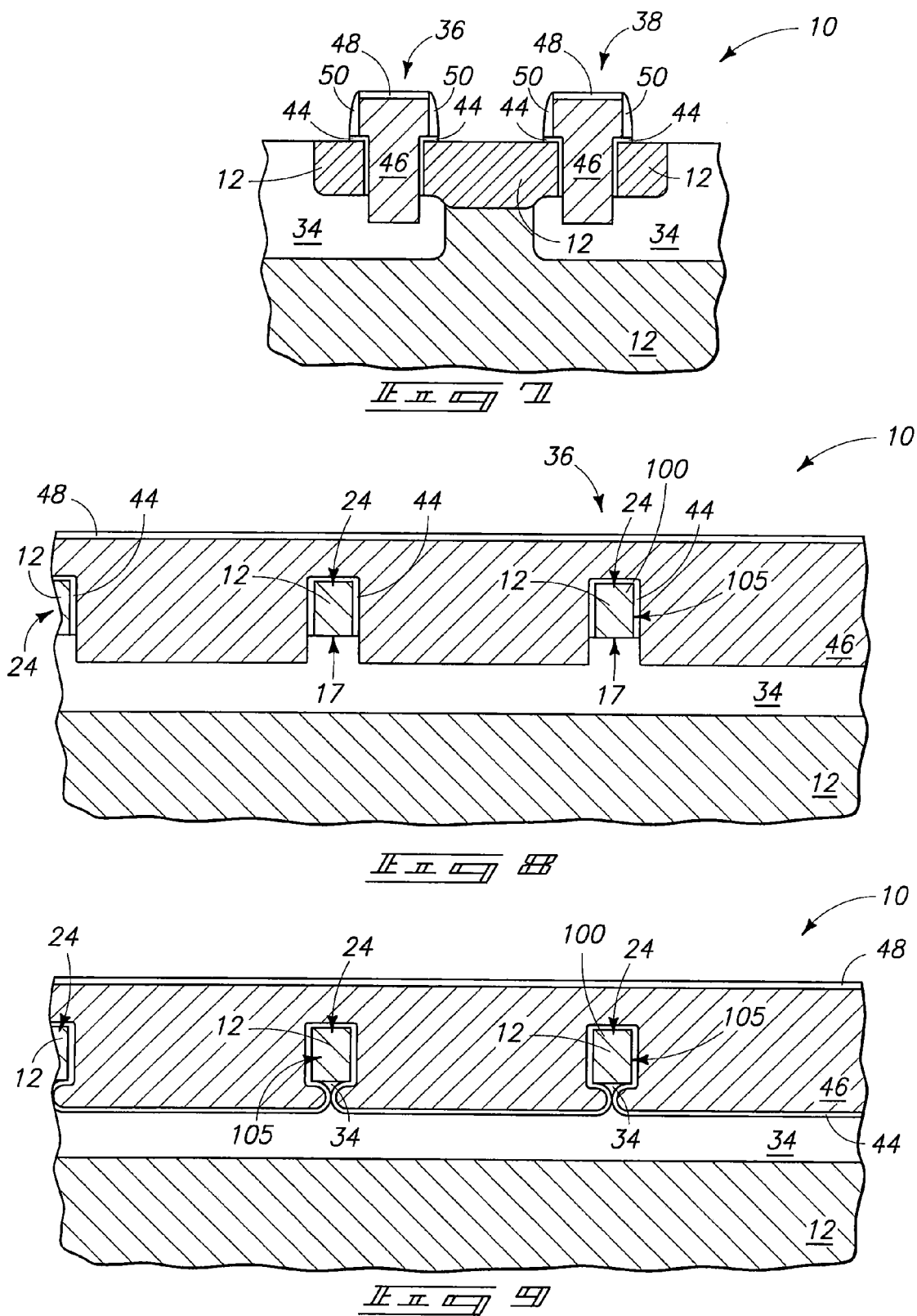

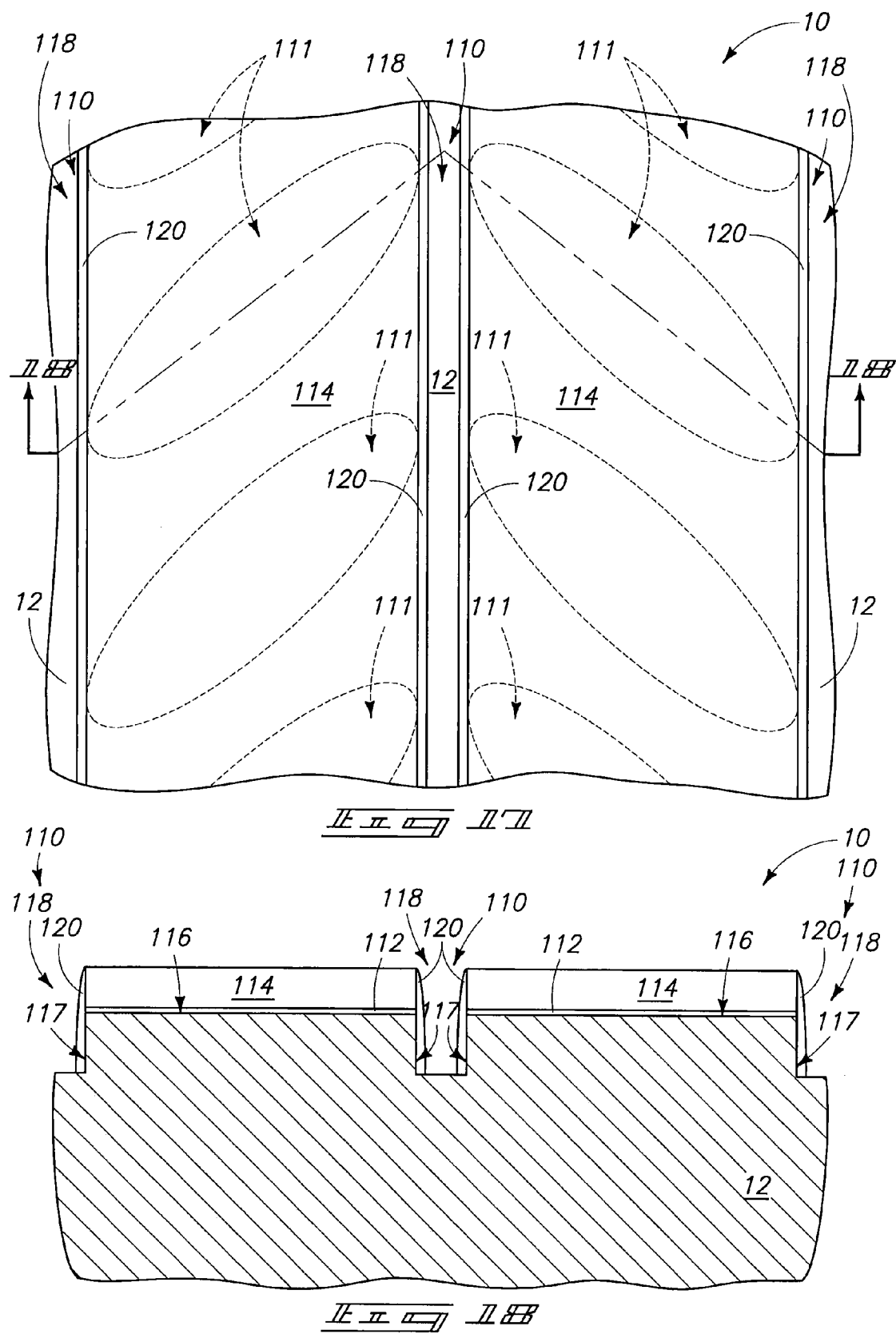

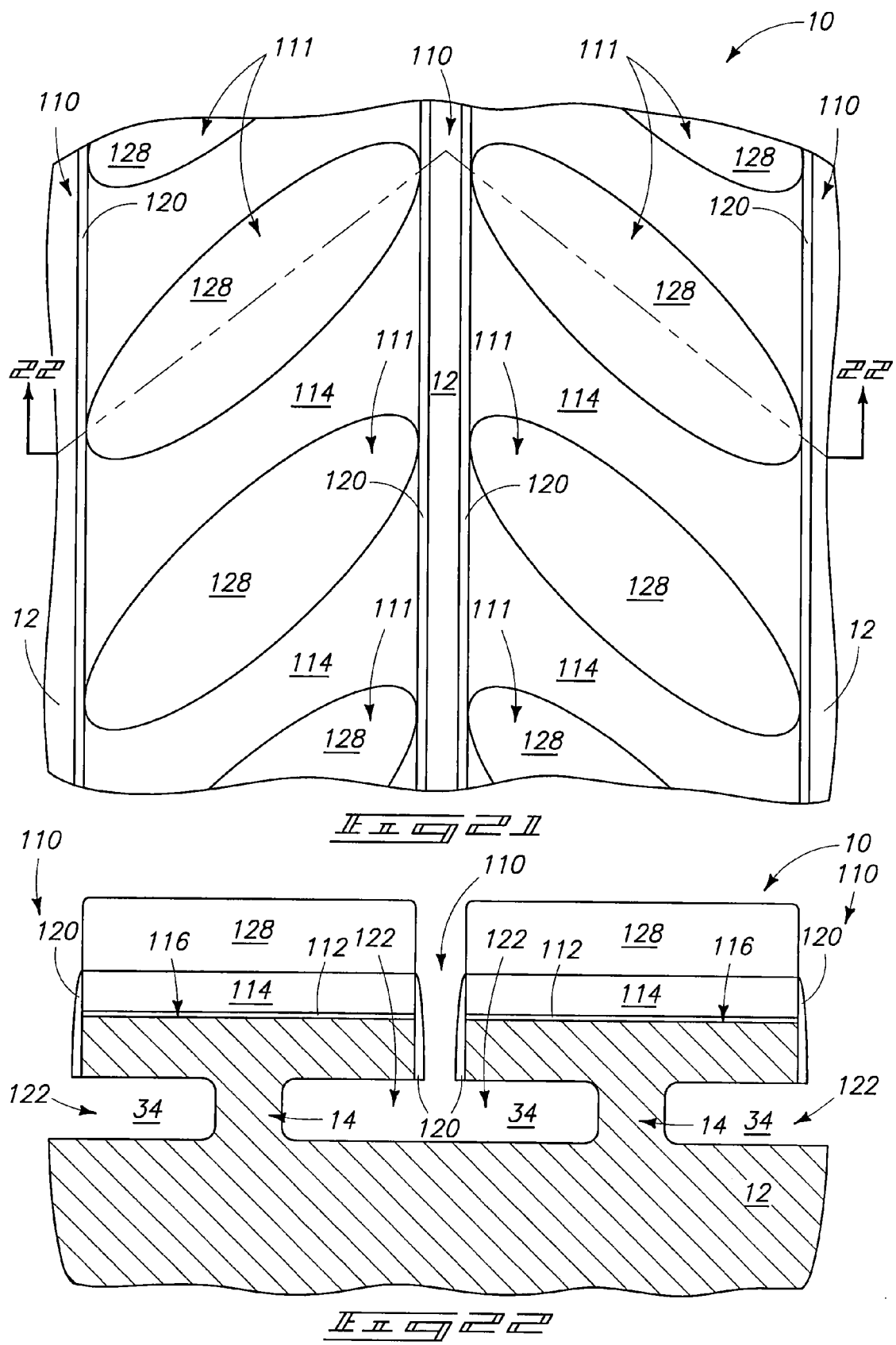

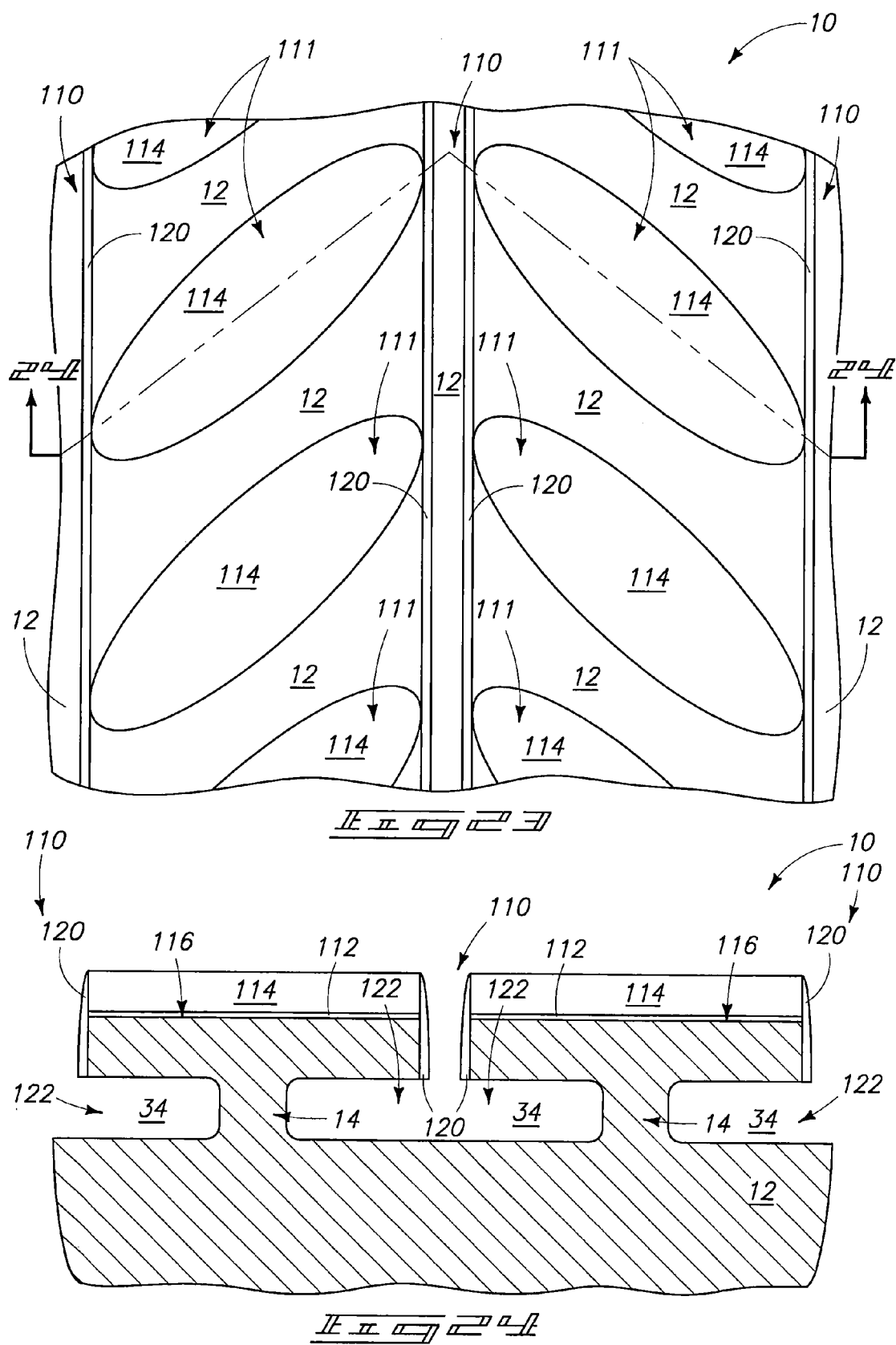

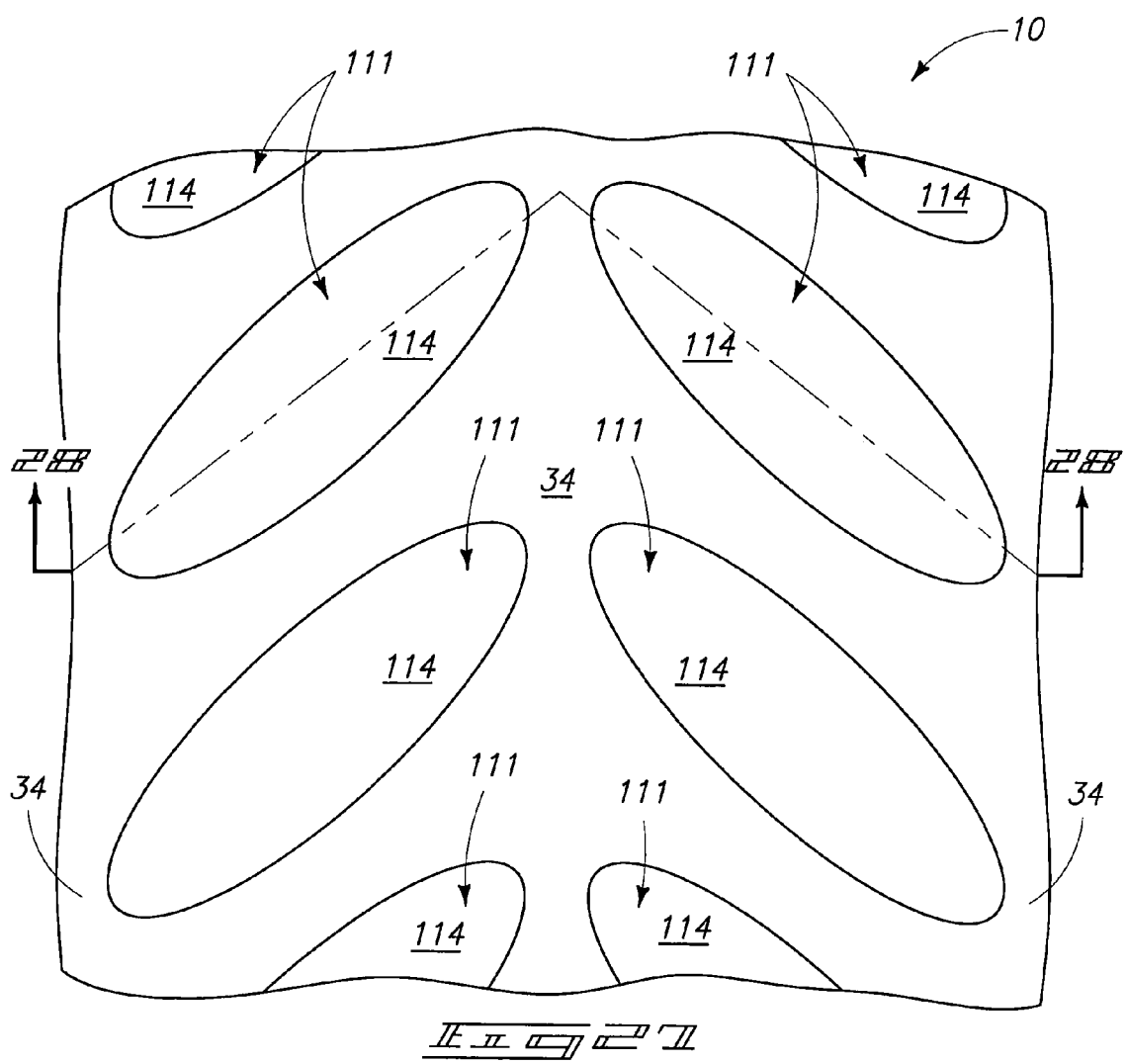
正正 27
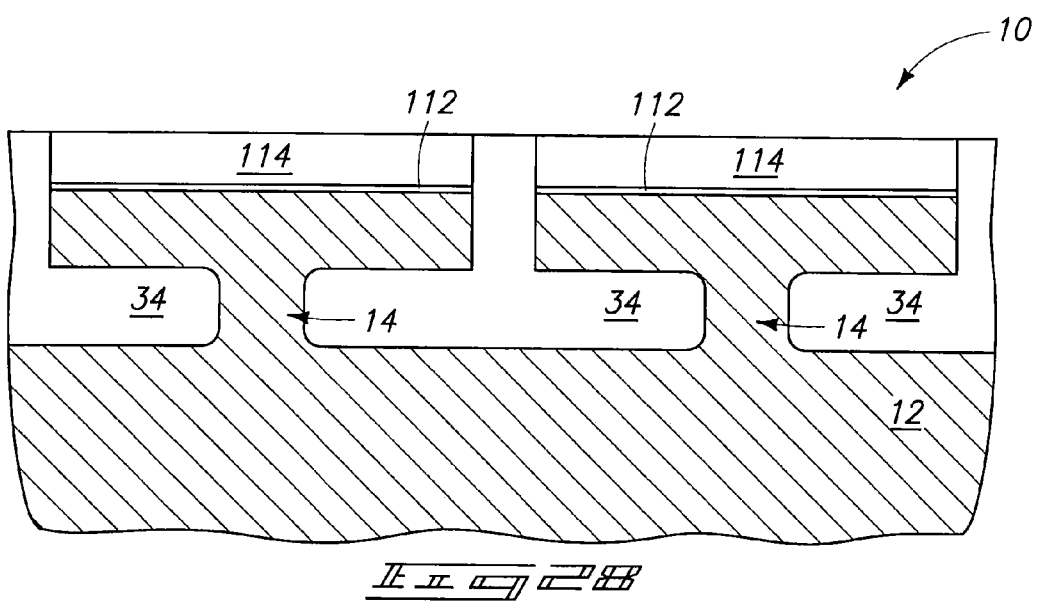
正正 28

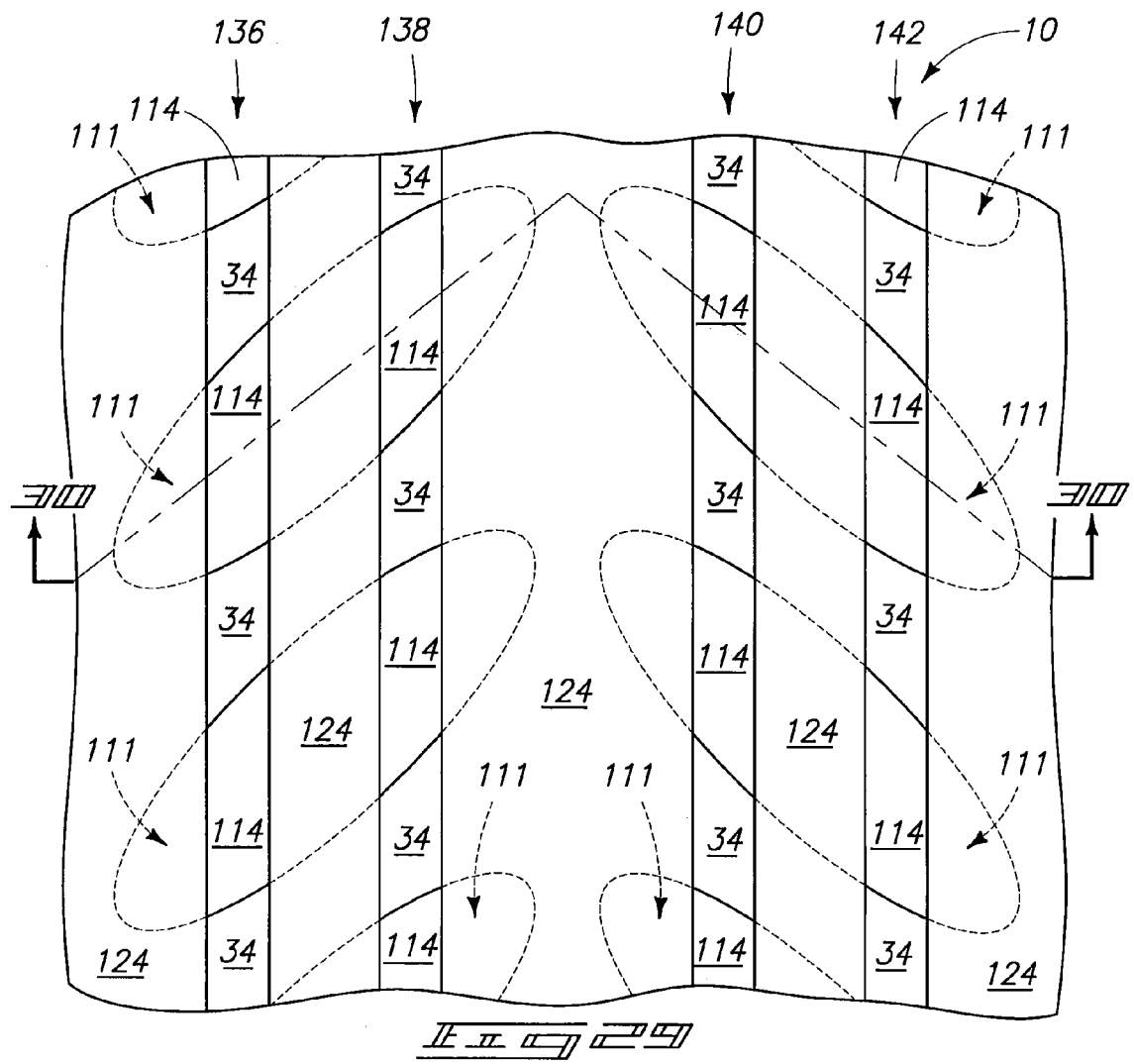
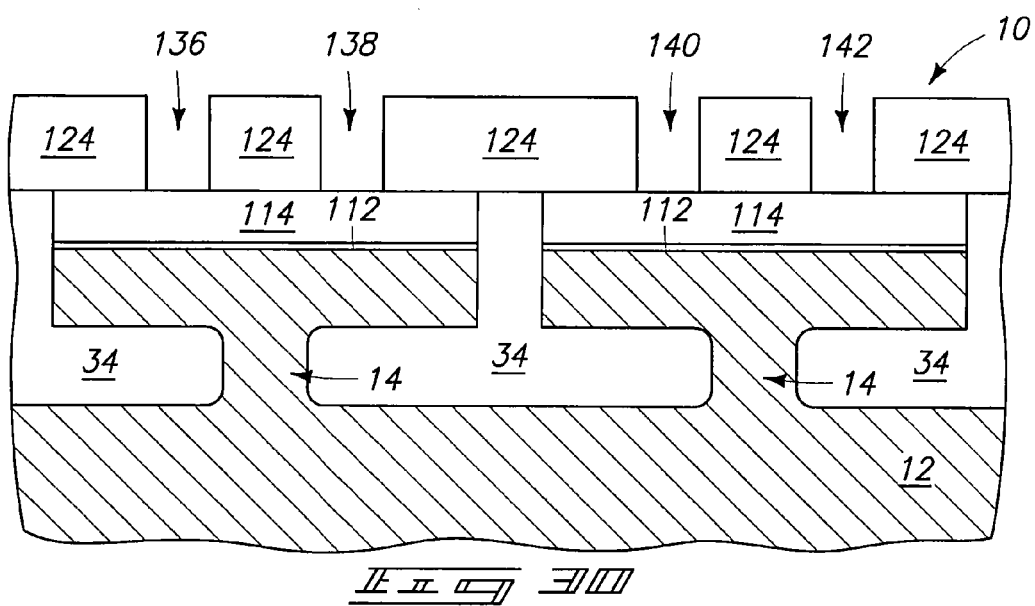

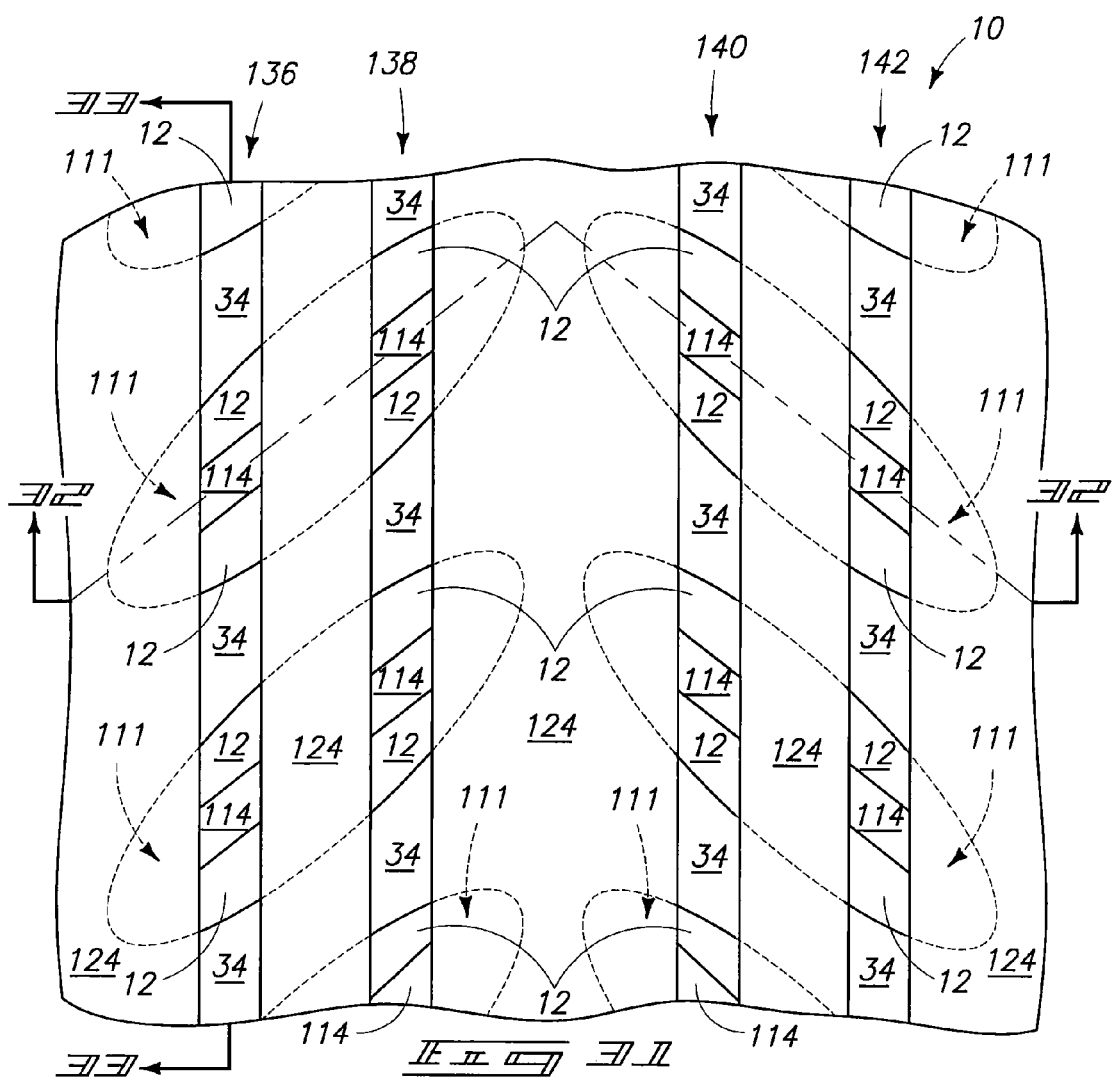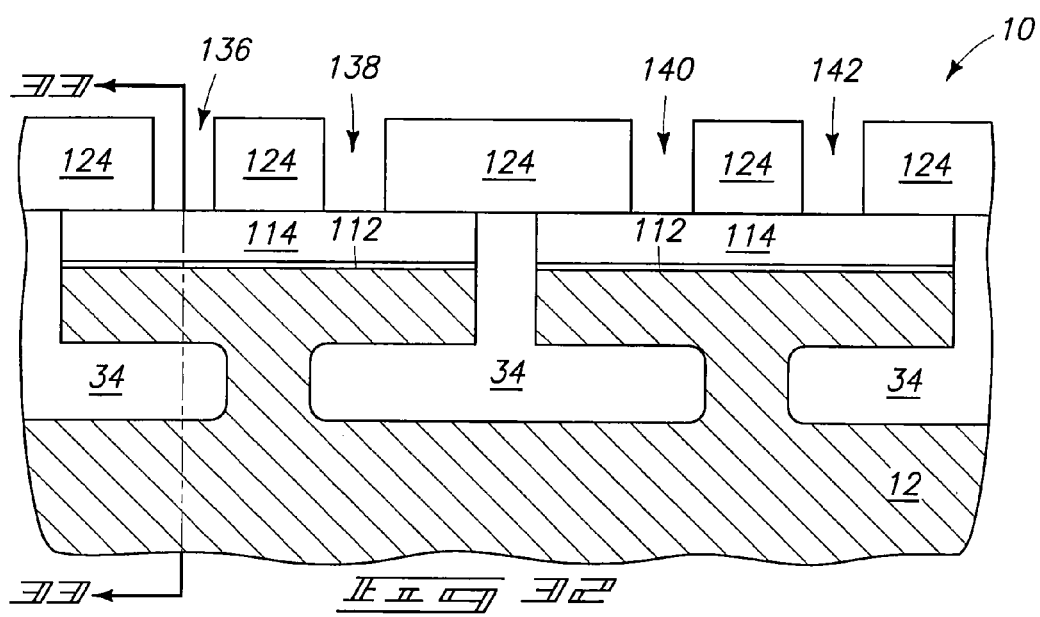

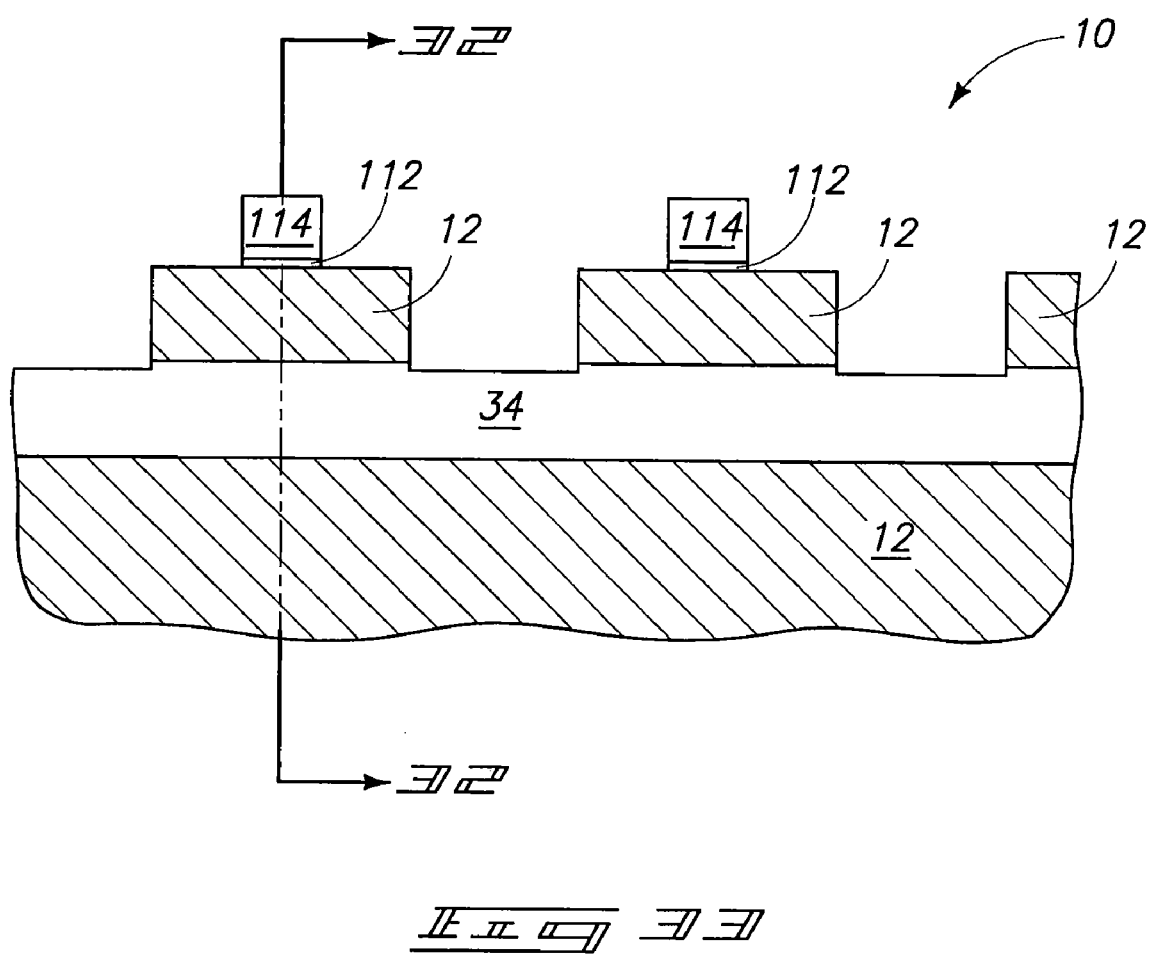

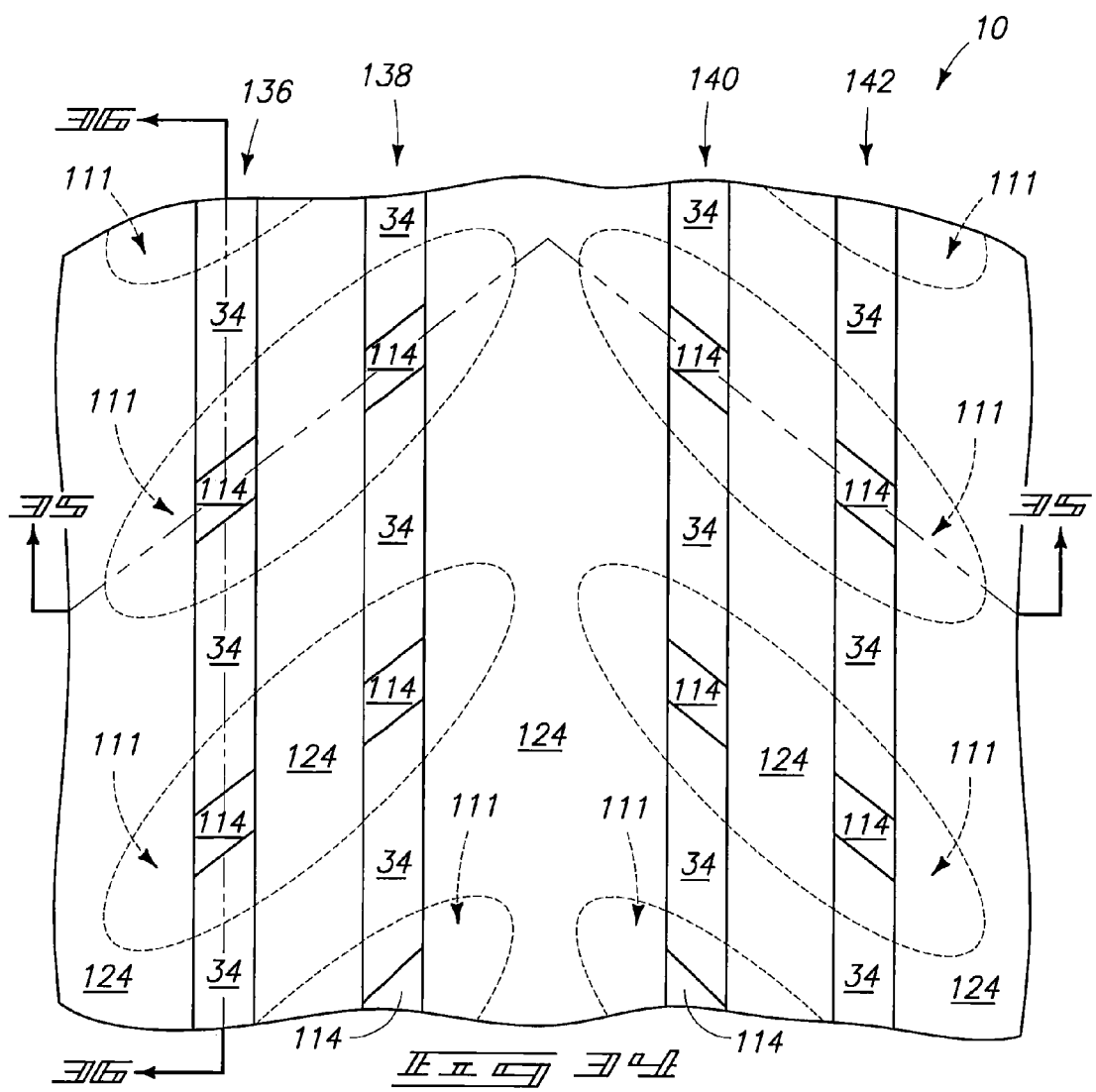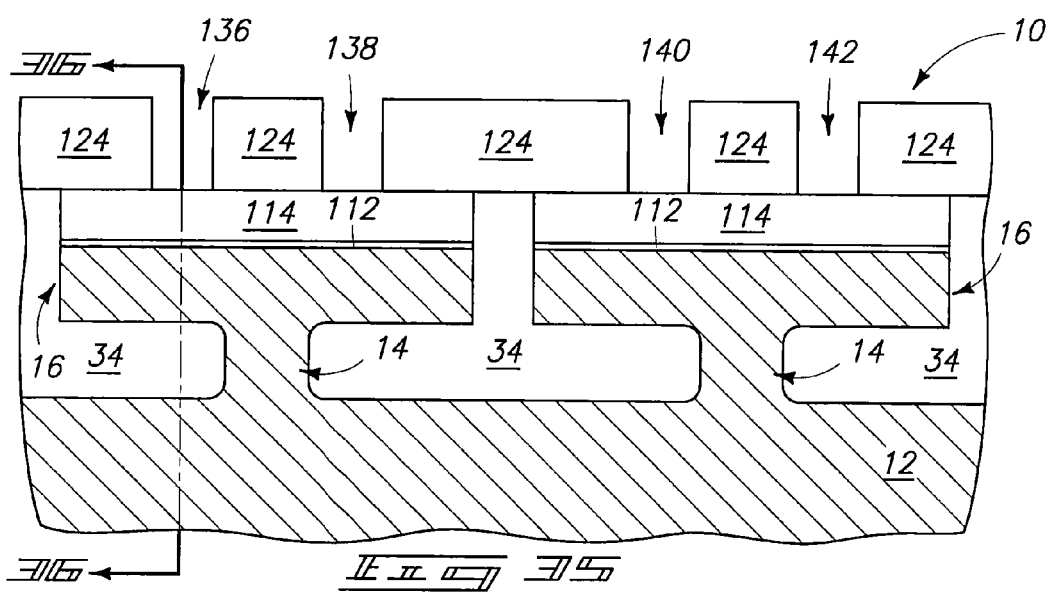

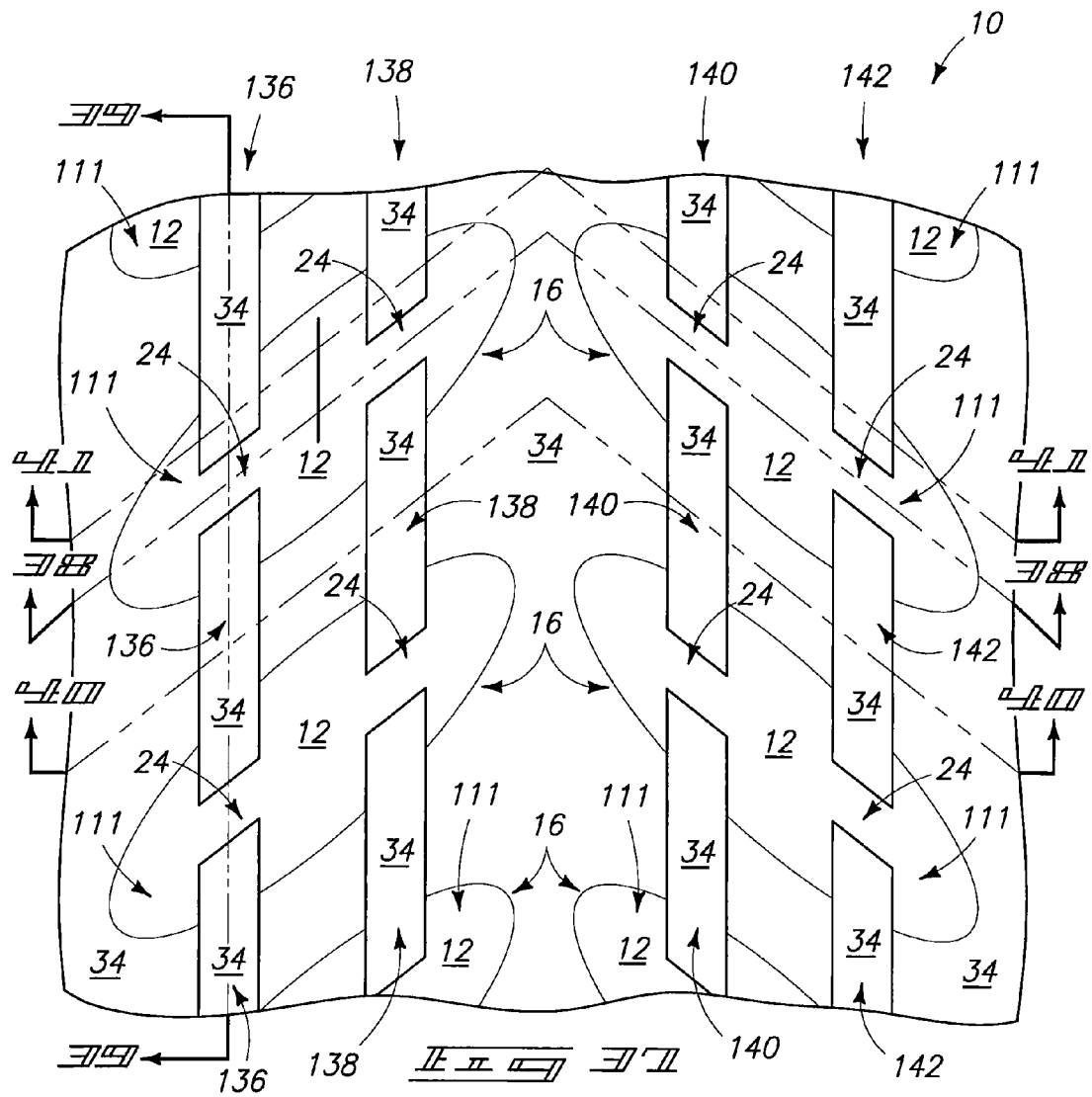
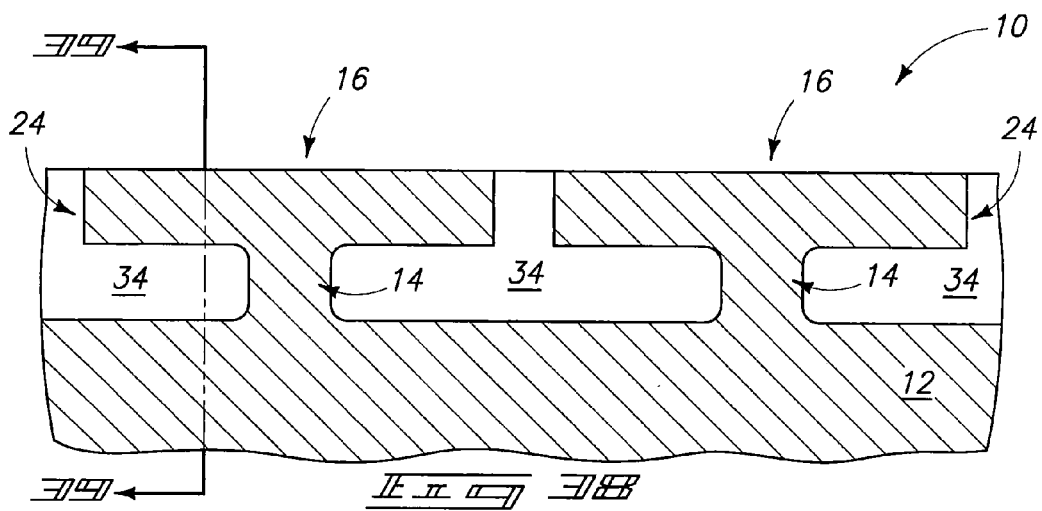

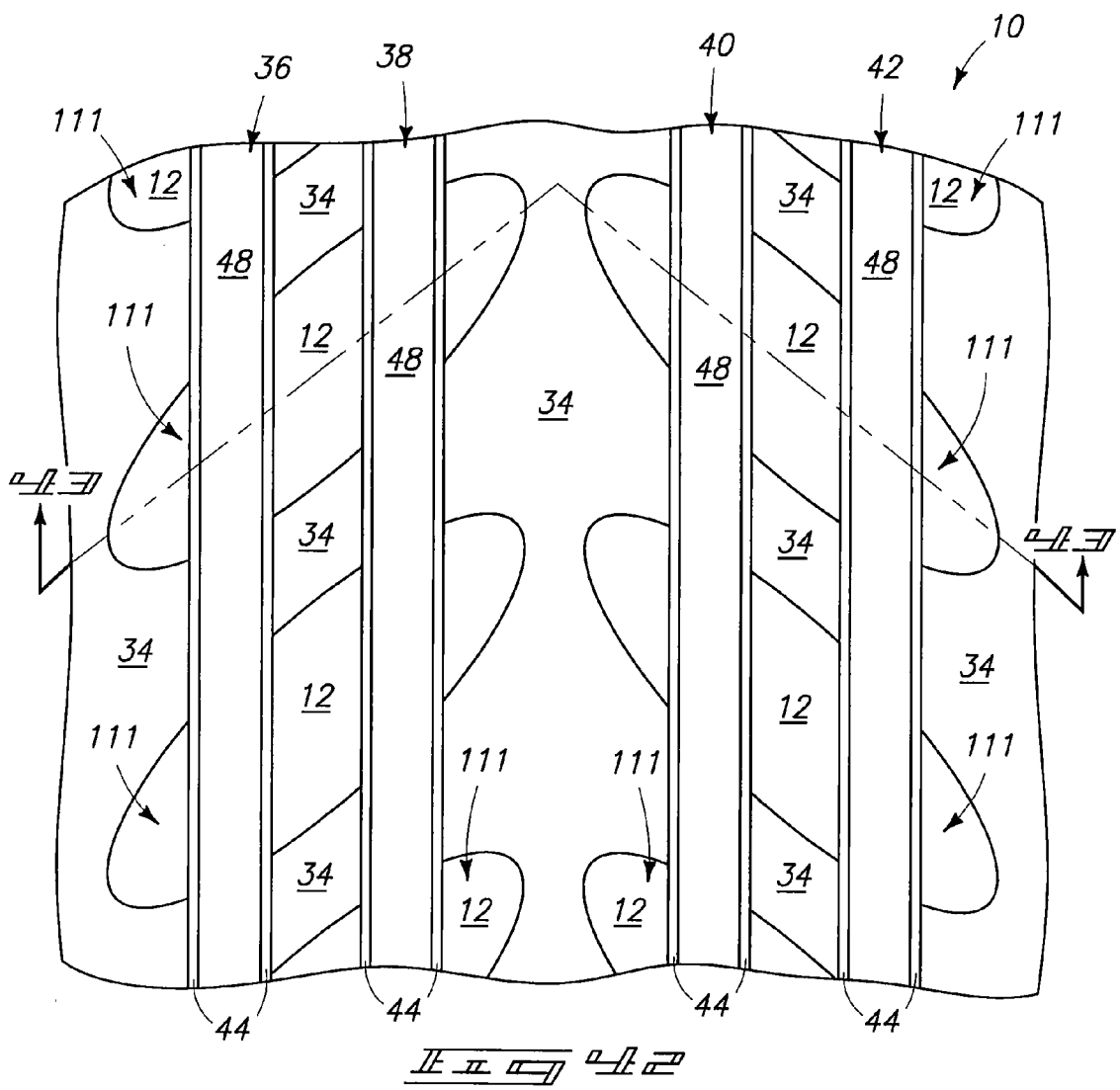
F I G 42
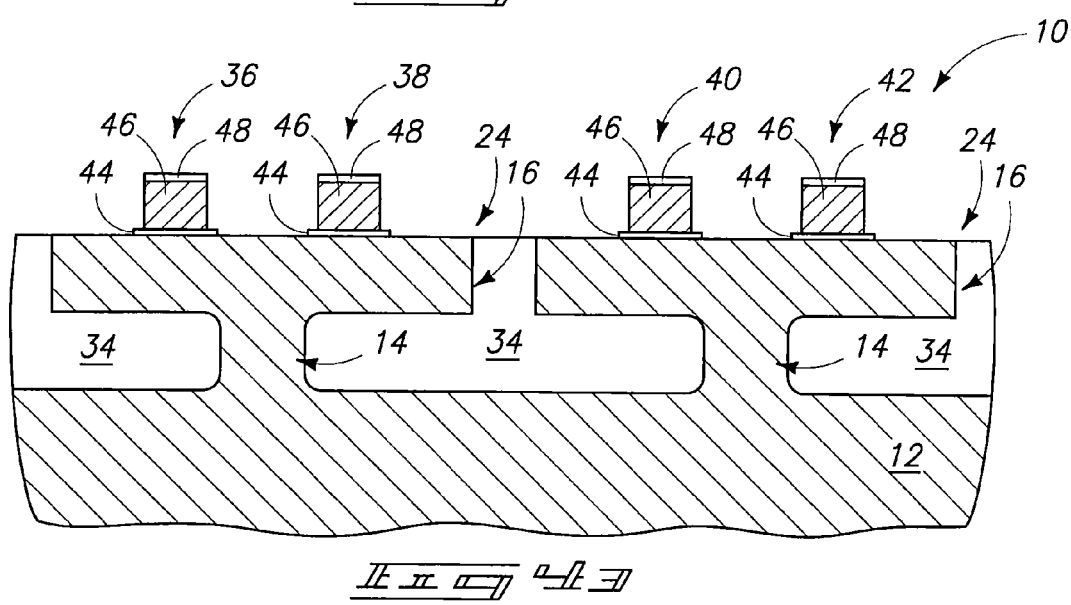
F I G 43

SEMICONDUCTOR CONSTRUCTIONS INCLUDING GATE ARRAYS FORMED ON PARTIAL SOI SUBSTRATE

RELATED PATENT DATA

This patent resulted from a divisional of U.S. patent application Ser. No. 11/436,726, which was filed May 17, 2006 now U.S. Pat. No. 7,422,960, and which is hereby incorporated herein by reference.

TECHNICAL FIELD

The invention pertains to semiconductor constructions, to dynamic random access memory (DRAM) arrays, and to methods of forming semiconductor constructions, such as, for example, DRAM arrays.

BACKGROUND OF THE INVENTION

Dynamic random access memory (DRAM) is utilized in numerous electronic systems. A continuing goal is to increase the level of integration, with a corresponding goal to decrease the size of memory devices. As the design rule of memory devices decreases, channel doping within transistors associated with the memory devices is increased to alleviate short channel effects. However, the increased channel doping can cause increased leakage at junctions, which can render it increasingly difficult to obtain sufficient data retention time within the memory devices.

Another continuing goal of DRAM fabrication is to decrease the refresh rate associated with DRAM. Presently, DRAM is typically refreshed several hundreds of times per second, which can be a significant drain on batteries.

In some ways, the two goals discussed above are found to be incompatible with one another. Specifically, increased integration can lead to increased leakage, requiring faster refresh rates. It is desired to develop DRAM structures which can be formed to high levels of integration, and yet which can have low refresh rates; and to develop methods of forming such structures.

Although the invention was motivated, at least in part, by a desire to improve memory constructions (such as, for example, DRAM constructions), it is to be understood that the invention described herein can have additional applications besides utilization for memory constructions.

BRIEF DESCRIPTION OF THE DRAWINGS

Preferred embodiments of the invention are described below with reference to the following accompanying drawings.

FIGS. 1-5 are views of a semiconductor construction illustrating an exemplary aspect of the present invention. FIG. 1 is a diagrammatic, top view of the construction; and FIGS. 2-5 are diagrammatic, cross-sectional views along the lines 2-2, 3-3, 4-4 and 5-5 of FIG. 1, respectively. Also, the view of FIG. 2 is along the lines 2-2 of FIGS. 3 and 4; the view of FIG. 5 is along the lines 5-5 of FIGS. 3 and 4; the view of FIG. 3 is along the lines 3-3 of FIGS. 2 and 5; and the view of FIG. 4 is along the lines 4-4 of FIGS. 2 and 5.

FIGS. 7 and 8 are views along the cross-sections of FIGS. 4 and 2, respectively, illustrating an aspect of the invention alternative to that of FIGS. 1-6.

FIG. 9 is a view along the cross-section of FIG. 2 illustrating an aspect of the invention alternative to those of FIGS. 1-8.

FIG. 12 is a view along the line 12-12 of FIG. 11.

FIGS. 17 and 18 are views of the fragments of FIGS. 11 and 12, respectively, shown at a processing stage subsequent to that of FIGS. 15 and 16. The cross-section of FIG. 18 is along the line 18-18 of FIG. 17.

FIGS. 21 and 22 are views of the fragments of FIGS. 11 and 12, respectively, shown at a processing stage subsequent to that of FIGS. 19 and 20. The cross-section of FIG. 22 is along the line 22-22 of FIG. 21.

FIGS. 23 and 24 are views of the fragments of FIGS. 11 and 12, respectively, shown at a processing stage subsequent to that of FIGS. 21 and 22. The cross-section of FIG. 24 is along line 24-24 of FIG. 23.

FIGS. 27 and 28 are views of the fragments of FIGS. 11 and 12, respectively, shown at a processing stage subsequent to that of FIGS. 25 and 26. The cross-section of FIG. 28 is along line 28-28 of FIG. 27.

FIGS. 29 and 30 are views of the fragments of FIGS. 11 and 12, respectively, shown at a processing stage subsequent to that of FIGS. 27 and 28. The cross-section of FIG. 30 is along line 30-30 of FIG. 29.

FIGS. 31-33 are views of the construction of FIGS. 11 and 12 shown at a processing stage subsequent to that of FIGS. 29 and 30. FIGS. 31 and 32 correspond to the fragments of FIGS. 11 and 12 shown at the processing stage subsequent to that of FIGS. 29 and 30. FIG. 33 corresponds to a cross-section crossing that of FIG. 32. The cross-section of FIG. 32 is along lines 32-32 of FIGS. 31 and 33; and the cross-section of FIG. 33 is along the lines 33-33 of FIGS. 31 and 32.

FIGS. 34-36 are views of the construction of FIGS. 11 and 12 shown at a processing stage subsequent to that of FIGS. 31-33. FIGS. 34 and 35 correspond to the fragments of FIGS. 11 and 12 shown at the processing stage subsequent to that of FIGS. 31-33. FIG. 36 corresponds to a cross-section crossing that of FIG. 35. The cross-section of FIG. 35 is along lines 35-35 of FIGS. 34 and 36; and the cross-section of FIG. 36 is along the lines 36-36 of FIGS. 34 and 35.

FIGS. 37-41 are views of the construction of FIGS. 11 and 12 shown at a processing stage subsequent to that of FIGS. 34-36. FIGS. 37-39 correspond to the fragments of FIGS. 34-36, respectively, shown at the processing stage subsequent to that of FIGS. 34-36. FIGS. 40 and 41 correspond to cross-sections crossing that of FIG. 39 at different locations than the cross-section of FIG. 38. The cross-section of FIG. 38 is along the lines 38-38 of FIGS. 37 and 39; the cross-section of FIG. 39 is along the lines 39-39 of FIGS. 37, 38, 40 and 41; the cross-section of FIG. 40 is along lines 40-40 of FIGS. 37 and 39; and the cross-section of FIG. 41 is along the lines 41-41 of FIGS. 37 and 39.

FIGS. 42 and 43 are views of the construction of FIGS. 11 and 12 shown at a processing stage subsequent to that of FIGS. 37-41. FIG. 42 is a view of the fragment of FIG. 10 shown at the processing stage subsequent to that of FIGS. 37-41; and FIG. 43 is a view along line 43-43 of FIG. 42.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In some aspects, the invention includes DRAM constructions containing capacitors with storage nodes electrically coupled to access transistor source/drain regions; with such source/drain regions being isolated from bulk semiconductor material by pseudo-SOI technology to avoid junction leakage; and with the access transistors having channel regions predominately, or even entirely, surrounded by conductive gate material. DRAM constructions of the present invention can have much lower refresh rates than conventional DRAM constructions, and in particular aspects can have refresh rates of less than 10 times per second, less than one time per second, or even less than once every 10 seconds.

Figure 6:
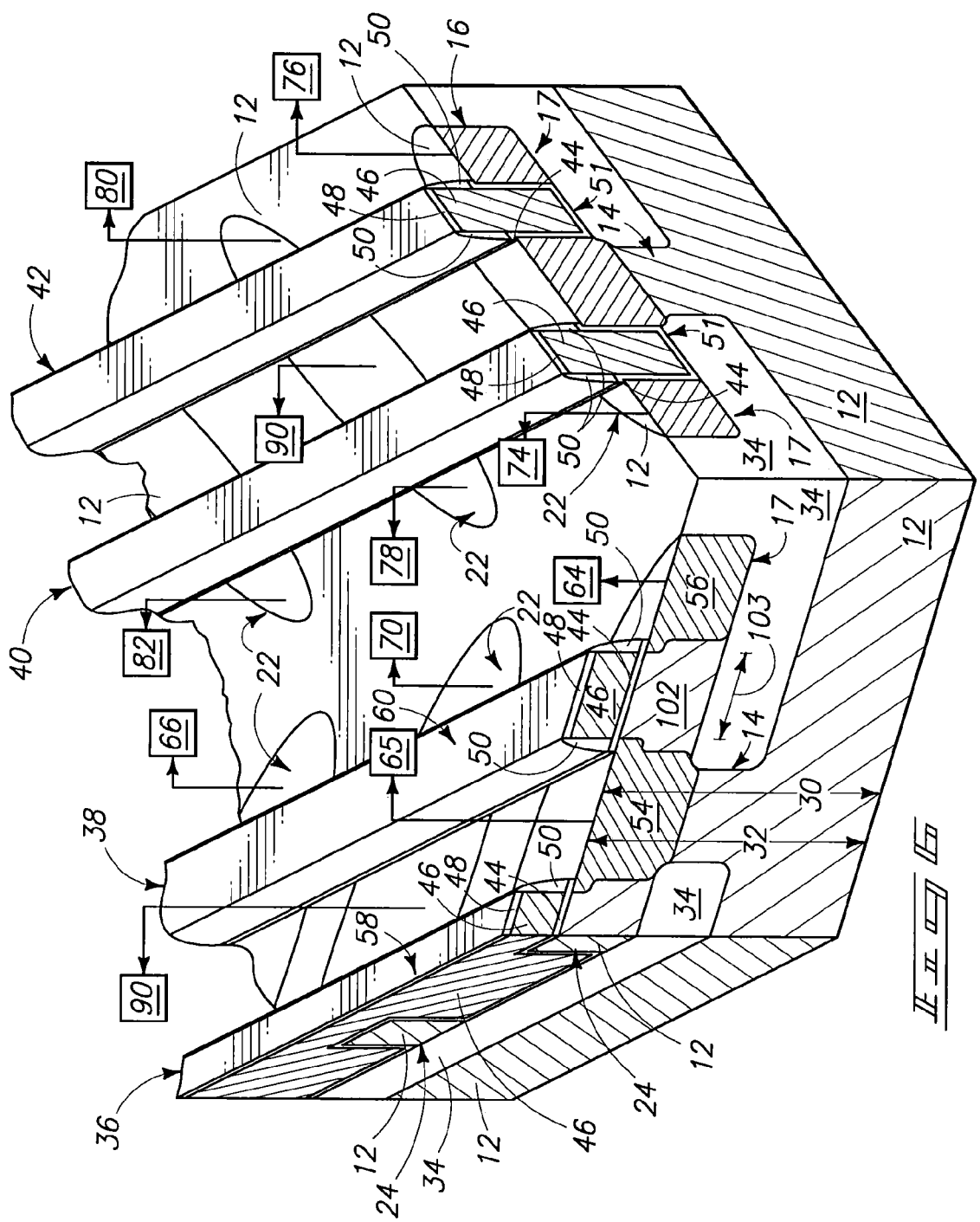
FIG. 6 is a diagrammatic, three-dimensional view of the construction of FIGS. 1-5. One side of the structure FIG. 6 corresponds to a cross-sectional view analogous to that shown in FIG. 2, another corresponds to a cross-sectional view analogous to that shown in FIG. 3, and another side corresponds to a cross-sectional view analogous to that shown in FIG. 4.

An exemplary arrangement and configuration of access transistors is described with reference to a construction 10 of FIGS. 1-6. FIG. 1 shows a top view of the construction; FIGS. 2-5 show various cross-sectional views; and FIG. 6 shows a three-dimensional view, with one side similar to the cross-section of FIG. 2, another similar to the cross-section of FIG. 3, and another similar to the cross-section of FIG. 4. To simplify the drawings, only structures within the planes of the cross-sections are shown, rather than also showing structures behind the planes of the cross-sections.

Construction 10 comprises a semiconductor base 12. Base 12 can comprise any suitable semiconductor material, and can, for example, comprise, consist essentially of or consist of monocrystalline silicon. In particular aspects, the monocrystalline silicon can be lightly doped with background dopant (typically p-type dopant). The base 12 can be bulk monocrystalline material of a semiconductor wafer. In some aspects, the base 12 can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Semiconductor material of base 12 is shown with cross-hatching in the cross-sections of the figures. Such cross-hatching is utilized to distinguish the semiconductor material of base 12 from other materials rather than to indicate electrical conductivity of the base.

The semiconductor material of base 12 is patterned to form a plurality of mesas (or stalks) 14 which extend upwardly to caps 16, (the mesas 14 are shown in the cross-sections of FIGS. 3-6; and one mesa is shown in phantom view in the top view of FIG. 1 to illustrate the approximate location of the mesa 14 relative to other features). The caps ultimately define active regions for access transistor devices.

Figure 4:
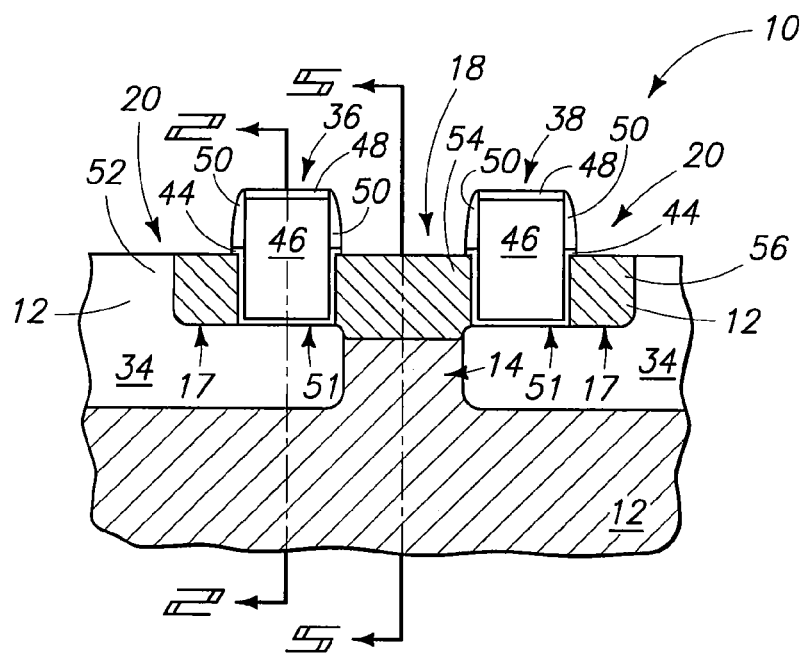
Figure 5:
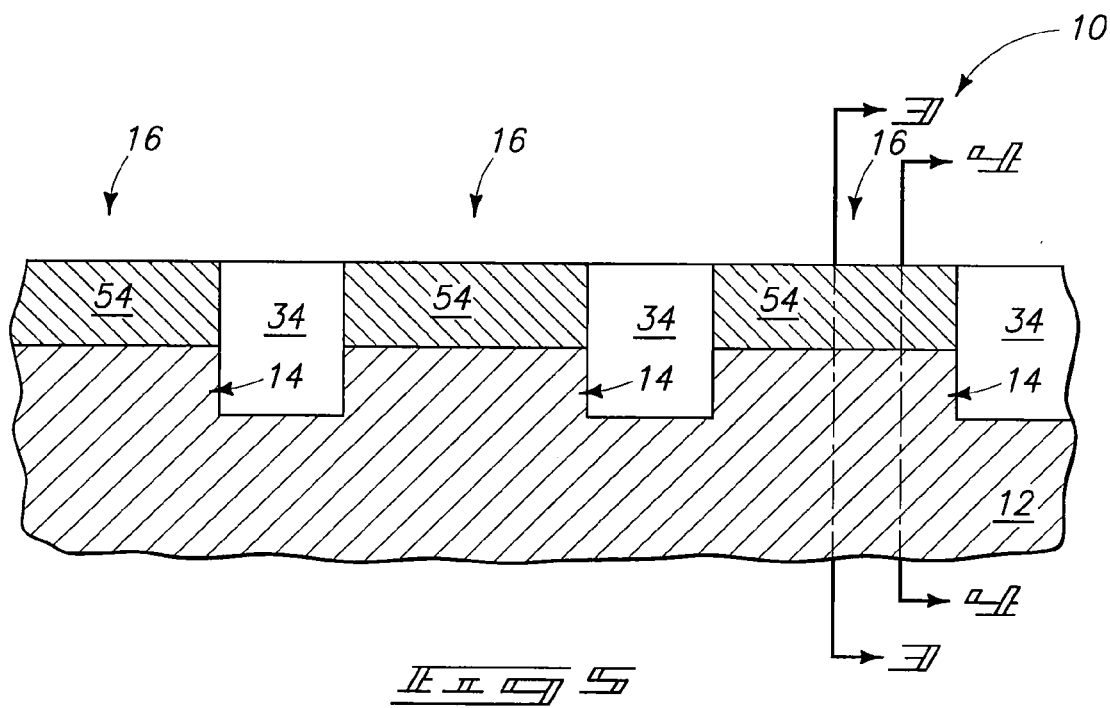

The caps 16 can be considered to comprise segments 18 directly over the mesas 14, and other segments 20 that extend laterally outward beyond the mesas (with the segments 18 and 20 being shown in FIGS. 3 and 4).

The semiconductive material 12 can be considered to have a thickness 30 (shown in FIGS. 3 and 6), and a vertical direction 32 can be defined to extend through such thickness.

An electrically insulative material 34 surrounds mesas 14 and separates caps 16 from one another. Insulative material 34 can comprise any suitable composition or combination of compositions, and in particular aspects will comprise, consist essentially of, or consist of an oxide. For instance, the insulative material 34 can comprise, consist essentially of, or consist of silicon dioxide or doped silicon oxide—with exemplary doped silicon oxide being borophosphosilicate glass (BPSG), phosphosilicate glass (PSG), fluorosilicate glass (FSG), etc.

Lines 36, 38, 40 and 42 of gate dielectric material 44, conductive gateline material 46 and protective insulative material 48 extend across caps 16, and across the insulative material 34 between the caps. The gate dielectric material can comprise any suitable composition or combination of compositions, and can, for example, comprise, consist essentially of, or consist of silicon dioxide. The electrically conductive gateline material can comprise any suitable composition or combination of compositions, and can, for example, comprise, consist essentially of, or consist of one or more of various metals, metal compositions or conductively-doped semiconductor material (such as, for example, conductively-doped silicon). The protective insulative material can comprise any suitable composition or combination of compositions, and can, for example, comprise, consist essentially of, or consist of one or both of silicon nitride and silicon dioxide.

The lines 36, 38, 40 and 42 extend through portions of the caps 16 to the insulative material 34 (in other words, are within troughs that are etched through the caps, as discussed below with reference to FIGS. 37-43; with FIG. 4 showing a pair of lines penetrating through regions of the shown cap), and go over central ridges of the caps between the troughs (such ridges are labeled as 24, and visible in the cross-sections of FIGS. 2, 3 and 6). In the shown aspect of the invention, the caps 16 have lowermost surfaces 17 along insulative material 34; and the lines 36, 38, 40, 42 have lowermost surfaces 51 which are about even with the lowermost surfaces of the caps (as can be seen in FIGS. 2, 4 and 6). The invention includes other aspects (discussed below) in which the lines extend to beneath the lowermost surfaces of the caps.

Electrically insulative sidewall spacers 50 extend along sidewalls of the lines 36, 38, 40 and 42. The sidewall spacers can comprise any suitable composition or combination of compositions, and can, for example, comprise, consist essentially of, or consist of one or both of silicon dioxide and silicon nitride.

The caps 16 can be considered to define transistor device active regions on opposing sides of the gatelines, and source/drain regions are formed within such active regions. Exemplary source/drain regions 52, 54 and 56 are shown within the cross-section of FIG. 3. The source/drain regions are conductively-doped diffusion regions formed within semiconductor material 12, and can comprise n-type doped regions or p-type doped regions, as will be recognized by persons of ordinary skill in the art.

The source/drain regions 52 and 56 are laterally outward of the mesa 14, and thus directly over electrically insulative material 34 rather than being directly over the mesa. In contrast, the source/drain region 54 is directly over the mesa. An entirety of the source/drain region 54 can be directly over the mesa, or only a portion of the source/drain region 54 can be directly over the mesa.

The source/drain regions 52, 54 and 56, together with the material of gatelines 36 and 38, form a pair of transistor devices 58 and 60. The source/drain region 54 is shared between the devices, and in some aspects can be referred to as a first source/drain region; while the source/drain regions 52 and 56 are not shared and can be referred to as second and third source/drain regions.

Transistor devices 58 and 60 can be incorporated into a DRAM by electrically coupling the laterally outermost source/drain regions 52 and 56 to storage nodes of capacitors 62 and 64, respectively (with the capacitors being shown schematically by boxes in FIG. 3, and with it being understood that any suitable capacitors can be utilized); and by electrically coupling shared source/drain region 54 to a bitline 65 (with the bitline being shown schematically by a box).

The source/drain regions 52 and 56 can be referred to as storage node contacts in that such source/drain regions electrically contact storage nodes of capacitor devices. It is advantageous for the storage node contacts to be over the insulative material 34 (or in other words, to be formed as SOI structures, and specifically to be formed to be electrically isolated from the bulk semiconductor material supporting the transistor devices containing such source/drain regions), in that such can eliminate junction leakage which would otherwise occur if the storage node contacts were not vertically spaced from the bulk semiconductor material by the intervening insulative material 34. Since the source/drain regions 52 and 56 are part of SOI structures, and the source/drain region 54 is not an SOI structure, the transistor devices 58 and 60 can be considered to be partial SOI structures.

Source/drain regions analogous to the regions 52, 54 and 56 of FIG. 3 can be formed adjacent the gatelines across each of the caps 16 of FIG. 1, and such source/drain regions can then be connected to capacitors and bitlines to form DRAM unit cells analogous to those described with reference to FIG. 3. The source/drain regions are not labeled in FIG. 1, but capacitors 66, 68, 70, 72, 74, 76, 78, 80 and 82 are shown in addition to the capacitors 62 and 64 discussed above with reference to FIGS. 3 and 6; and are shown as being coupled to source/drain regions which would be within the shown caps 16. Also, bitlines 88 and 90 are shown in addition to the bitline 65 discussed above with reference to FIG. 3. The bitlines 65, 88 and 90 are shown being shared along adjacent rows of active regions. For instance, bitline 65 is shown extending between capacitors 62 and 64 of one active region, and also between capacitors 74 and 76 of an adjacent active region. Such would be a typical construction, but it is to be understood that the invention can also include other constructions.

Referring again to the view of FIG. 3, the source/drain regions 52 and 54 are shown to be spaced from one another by a channel region 100 within semiconductor material 12 and beneath gate dielectric 44 of gateline 36; and the source/drain regions 54 and 56 are shown to be spaced from one another by a channel region 102 within semiconductor material 12 and beneath gate dielectric 44 of gateline 38. The channel regions 100 and 102 are shown contained within the SOI regions of caps 16, or in other words are shown to be directly over insulative material 34.

As discussed previously, the thickness of semiconductor material 12 can be considered to define a vertical direction 32. In the shown aspect of the invention, the source/drain regions 52, 54 and 56, together with the channel regions 100 and 102 between such source/drain regions, form segments that extend primarily horizontally (i.e., primarily orthogonally to the vertical direction 32).

The channel regions 100 and 102 can be considered to comprise longitudinal axes 101 and 103, respectively, (shown in FIG. 3) which extend horizontally along the lengths of the channels, (or, in other words, which extend from a source/drain region on one side of a channel to the source/drain region on the other side of the channel). In the shown aspect of the invention, the longitudinal axis 103 of channel region 102 is parallel to the longitudinal axis 101 of channel region 100; and specifically can be considered an extension of the longitudinal axis of channel 100.

The channel regions comprise lateral peripheries along a cross-section substantially orthogonal to the longitudinal axes. The lateral periphery of the channel region 100 is visible in the view of FIG. 2 as a periphery 105 of semiconductor material 12. The shown lateral periphery has four sides, as the illustrated ridge 24 of material 12 is rectangular in shape. It is to be understood, however, that the lateral periphery can have any suitable geometry.

In the aspect of the invention of FIG. 2, the dielectric material 44 and conductive gate material 46 are shown extending along about three-fourths of the lateral periphery 105 (specifically, extend along three of the four sides of the lateral periphery). Such can advantageously enhance gating of the transistor comprising channel 100 relative to gating which would occur if less of the channel were encircled by the conductive gate material. In exemplary aspects of the invention, at least a segment of the longitudinal channel length of a field effect transistor will have at least about three-fourths of its lateral periphery surrounded by conductive gateline material.

The construction 10 of FIGS. 1-6 illustrates an aspect of the invention in which material of lines 36, 38, 40 and 42 is formed to extend through semiconductor material 12 of the caps 16 to the upper surface of insulative material 34, as is specifically illustrated in FIGS. 2, 4 and 6. The invention also includes aspects in which the material of the lines is recessed into the insulative 34, as shown in FIGS. 7-10. In referring to FIGS. 7-10, similar numbering will be used as was utilized above in describing FIGS. 1-6, where appropriate.

FIGS. 7 and 8 are views analogous to those of FIGS. 4 and 2, respectively, but are of an aspect of the invention in which gate dielectric material 44 and conductive gate material 46 are within trenches extending into insulative material 34. The trenches are substantially aligned with sidewalls of ridges 24, as illustrated in FIG. 8, so that the gate material extends to below the lowermost surface 17 of the semiconductor material 12 of the ridges, but does not extend to under the ridges.

In FIGS. 7 and 8, the gate dielectric material 44 is shown only along the semiconductor material 12, as would occur if the gate dielectric material were formed by oxidation of the semiconductor material rather than by deposition of the dielectric material. This aspect of the invention is shown in FIGS. 7 and 8 to illustrate that the gate dielectric material can be formed selectively only along semiconductor material 12. It is to be understood that the gate dielectric material could also be deposited to entirely line trenches within which the gatelines are formed.

FIG. 9 is a view analogous to that of FIG. 2, but illustrating an aspect of the invention in which the insulative material 34 is removed from beneath ridges 24 prior to formation of gate dielectric 44 and conductive gate material 46 so that the gate dielectric and conductive gate material extend to under semiconductor material 12 of ridges 24. If insulative material 34 comprises oxide, the material can be removed from under ridges 24 with any appropriate etch or combination of etches. Exemplary etches can include hydrofluoric acid etching, buffered oxide etching (which typically utilizes a hydrofluoric acid etchant with buffer therein), piranha etching (which utilizes sulfuric acid and hydrogen peroxide) and a so-called SC1 clean (which typically utilizes ammonium hydroxide and hydrogen peroxide).

The construction of FIG. 9 advantageously forms the conductive gate material substantially entirely around the lateral periphery of 105 of the channel region 100. The only portion of the lateral periphery not surrounded by the conductive gate material is a small portion blocked by gate dielectric 44. The substantially entire encirclement of the channel by the conductive gate material can significantly enhance gating relative to constructions in which the channel is less encircled by the conductive gate material. In some embodiments, the construction of FIG. 9 may be considered to comprise a channel 100 having lateral periphery 105 corresponding to a four-sided polygon along the cross-section of FIG. 9. The four-sided polygon of the channel has a bottom surface, a top surface, and a pair of side surfaces extending from the bottom surface to the top surface. Dielectric material 44 is conformally along and directly against the top and side surfaces of the four-sided polygon, and extends under an entirety of the bottom surface of such polygon. The dielectric material 44 is only directly against a portion of the bottom surface of the polygon, and is not conformal to such bottom surface. Instead, the dielectric material from one side of the four-sided polygon of the channel contacts the dielectric material from the other side of the polygon under the bottom surface at a contact location under the bottom surface, and a portion of insulative material 34 is over such contact location and between the contact location and the bottom surface of the four-sided polygon. The electrically conductive gate material 46 wraps around the lateral periphery of the channel and extends conformally along the dielectric along top and side surfaces of the four-sided polygon. The electrically conductive gate also extends to under the bottom surface of the four sided polygon, and is under an entirety of the bottom surface except for a region (the contact location) where the dielectric material from one side of the polygon contacts the dielectric material from the other side of the polygon.

Figure 10:
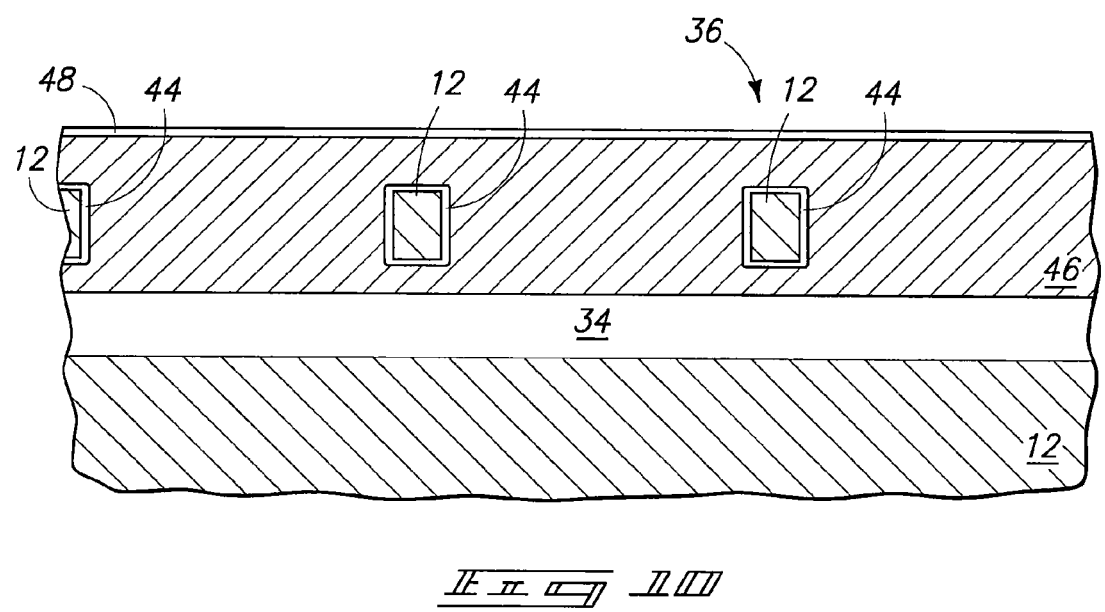
FIG. 10 is a view along the cross-section of FIG. 2 illustrating an aspect of the invention alternative to those of FIGS. 1-9.

FIG. 10 is a view analogous to that of FIG. 2, and illustrating an aspect of the invention in which the insulative material 34 is removed from beneath ridges 24 prior to formation of gate dielectric 44 and conductive gate material 46. The gate dielectric is formed only along semiconductor material 12, and the conductive gate material extends entirely around the semiconductor material 12 of the ridges 24.

The combination of the isolation of storage node-contacting source/drain regions (such as the source/drain regions 52 and 56 of FIG. 3) by partial SOI technology, with the substantial encirclement of transistor channel regions by conductive gate material, can significantly improve DRAM devices of the present invention relative to conventional DRAM devices. For instance, DRAM devices of the present invention can have very rapid response times, and can be maintained with low refresh rates. In particular aspects, DRAM arrays comprising transistors of the present invention can have refresh rates of less than 10 times per second, less than one time per second, or even less than once every 10 seconds.

The constructions of FIGS. 1-10 can be formed by any suitable methodology. An exemplary process is discussed below with reference to FIGS. 11-43. In referring to FIGS. 11-43, similar numbering will be used as was utilized above in describing FIGS. 1-10, where appropriate.

Figure 11:
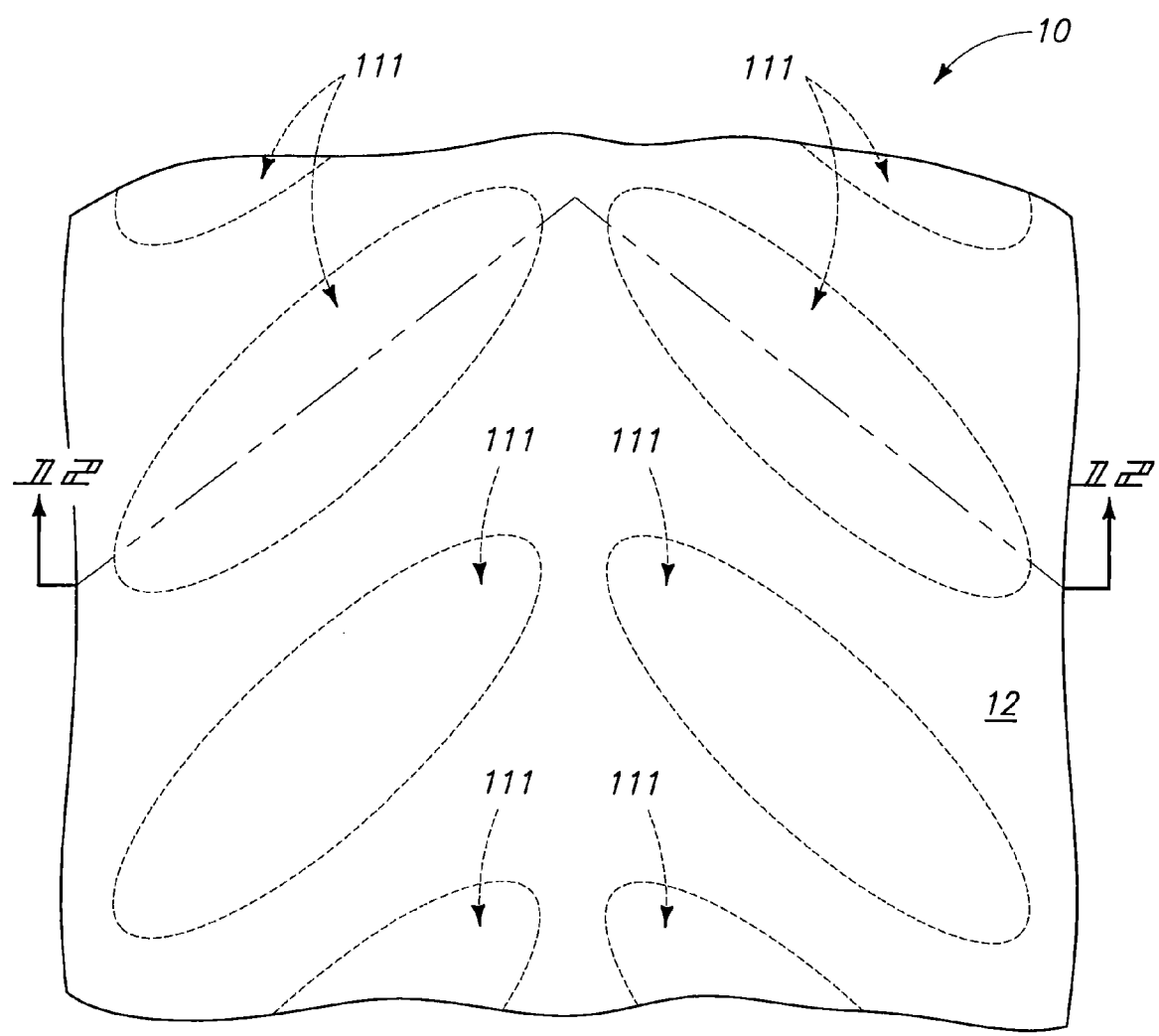
FIGS. 11 and 12 are a diagrammatic top view and cross-sectional side view, respectively, of fragments of a semiconductor construction at a preliminary processing stage in accordance with an exemplary methodological aspect of the present invention.
Figure 12:
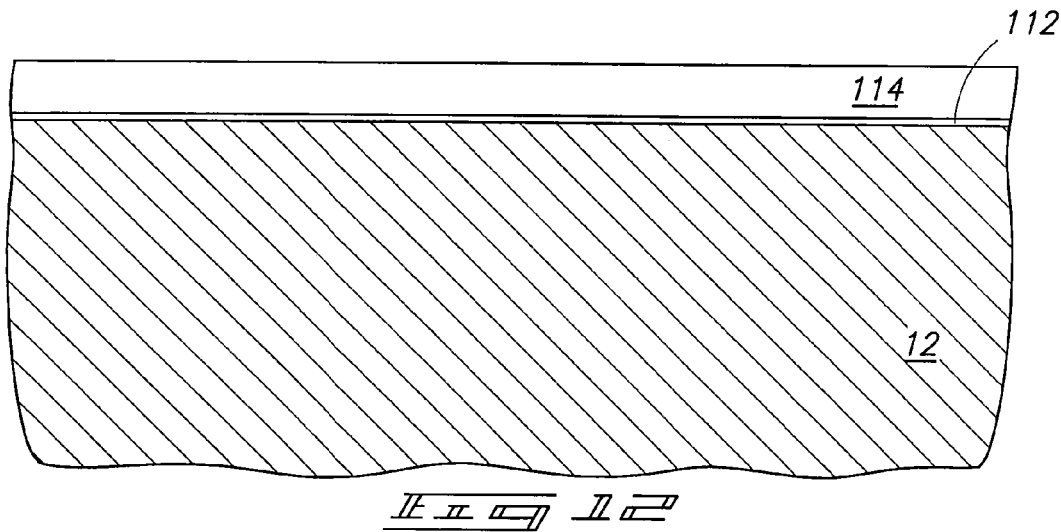

FIGS. 11 and 12 show an exemplary construction 10 at a preliminary processing stage. The construction comprises bulk semiconductor material 12, and can, for example, be a fragment of a monocrystalline silicon wafer. Masking material layers 112 and 114 are formed over the bulk semiconductor material. The layer 112 can, for example, comprise, consist essentially of, or consist of silicon dioxide; and the layer 114 can, for example, comprise, consist essentially of, or consist of silicon nitride. Locations where active areas will ultimately be formed (specifically, the areas 16 of FIGS. 1-6) are designated by dashed-lines as regions 111.

Figure 13:
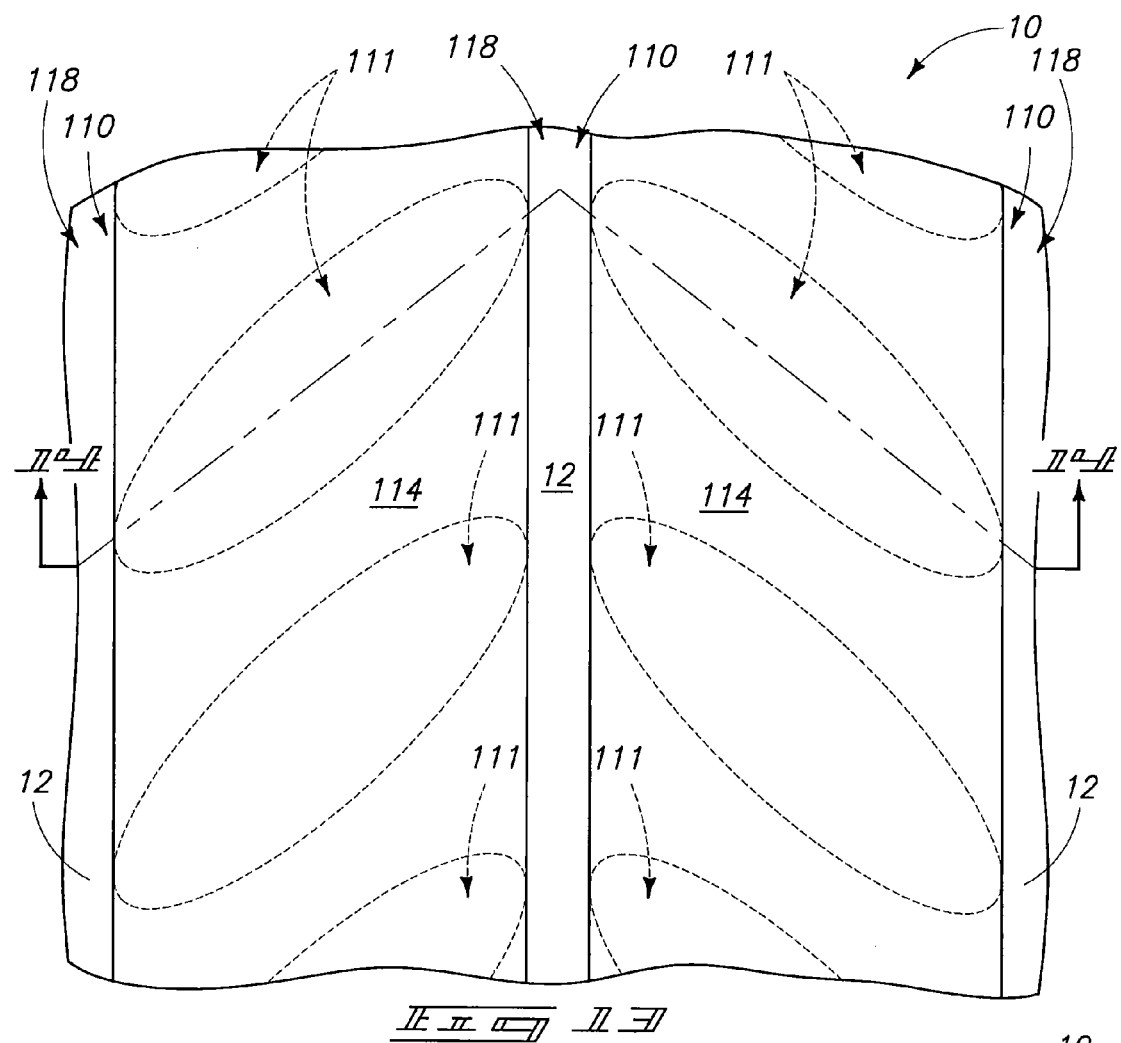
FIGS. 13 and 14 are views of the fragments of FIGS. 11 and 12, respectfully, shown at a processing stage subsequent to that of FIGS. 11 and 12. The cross-section of FIG. 14 is along the line 14-14 of FIG. 13.
Figure 14:
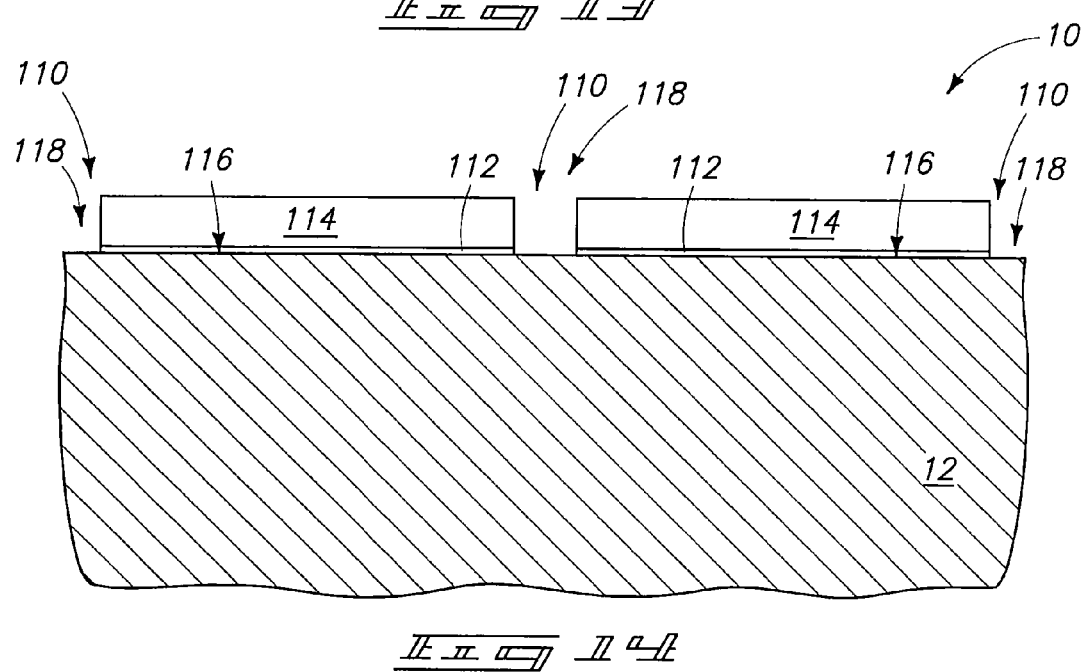

Referring next to FIGS. 13 and 14, trenches 110 are formed through masking material layers 112 and 114. The trenches leave first regions 116 of material 12 covered by the layers 112 and 114, while leaving second regions 118 of the material 12 exposed. Trenches 110 can be formed by providing photolithographically patterned photoresist (not shown) over the layers 112 and 114; transferring a pattern from the photoresist to the layers 112 and 114; and subsequently removing the photoresist.

Figure 15:
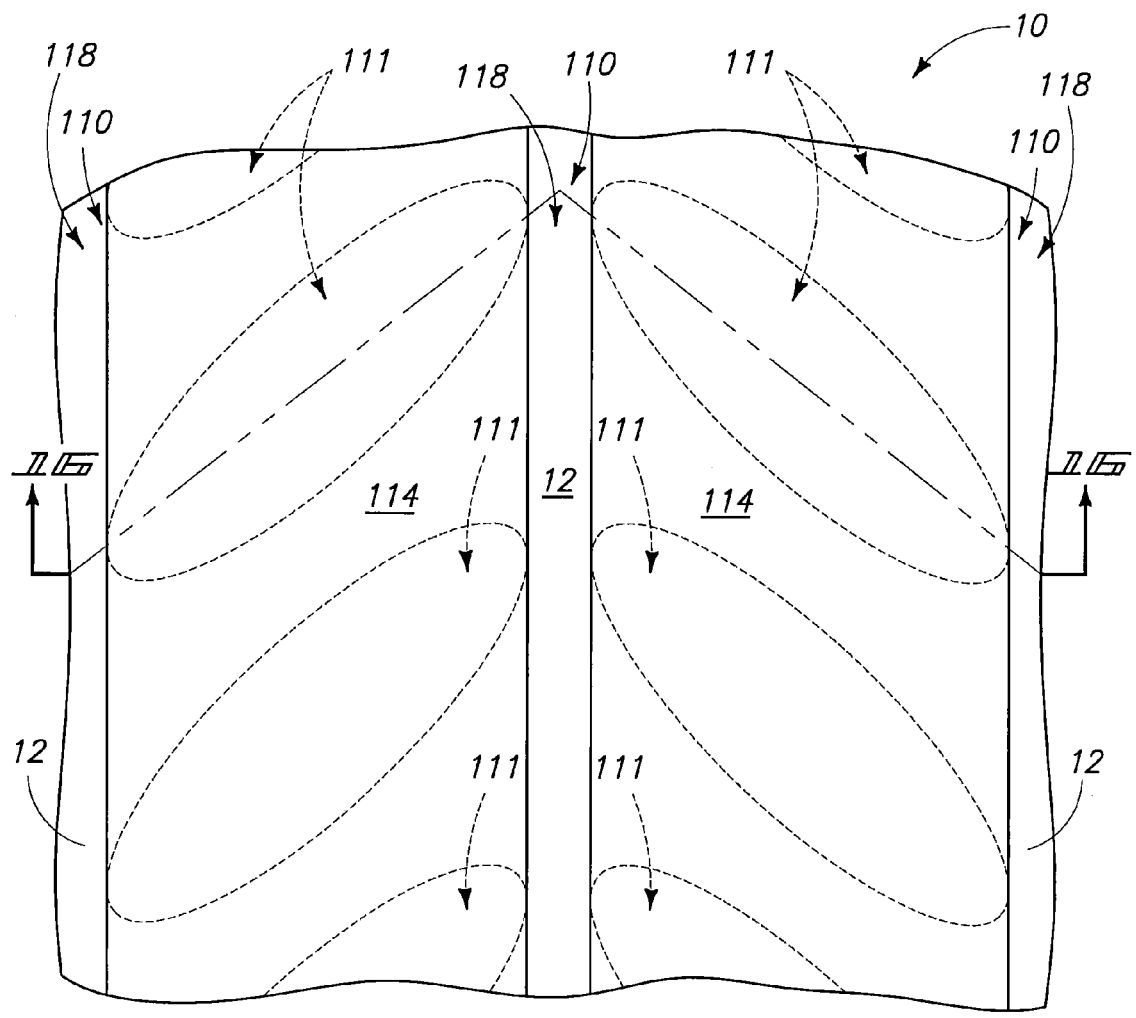
FIGS. 15 and 16 are views of the fragments of FIGS. 11 and 12, respectively, shown at a processing stage subsequent to that of FIGS. 13 and 14. The cross-section of FIG. 16 is along the line 16-16 of FIG. 15.
Figure 16:
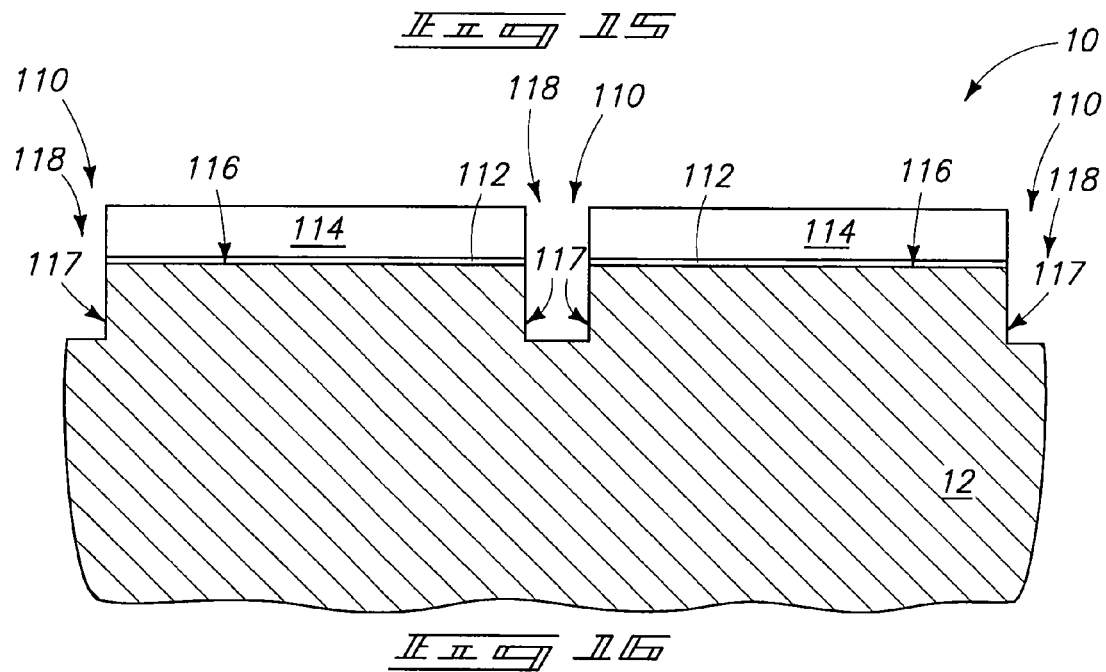

Referring next to FIGS. 15 and 16, semiconductor material 12 is subjected to an etch to remove some of the semiconductor material from the second regions 118, and thereby transfer trenches 110 into the semiconductor material 12. The etching recesses the second regions 118 of semiconductor material 12 relative to the first regions 116, and thus forms upwardly projecting portions of material 12 within regions 116. The upwardly projecting portions of material 12 have exposed sidewall surfaces 117; or, in other words, the trenches 110 within material 12 have exposed sidewall surfaces 117.

Referring next to FIGS. 17 and 18, sidewall spacers 120 are formed along sidewall surfaces 117 of the trenches 110. The sidewall spacers protect sidewalls 117 of the upwardly projecting portions of material 12 from a subsequent etch (discussed below with reference to FIGS. 19 and 20).

Sidewall spacers 120 can comprise any suitable material to which semiconductor material 12 can be selectively etched (with the term "selectively etched" meaning that material 12 is removed at a faster rate than the material of spacers 120, which can include, but is not limited to, etches which are 100 percent selective for material 12 relative to the material of spacers 120). Sidewall spacers 120 can, for example, comprise, consist essentially of, or consist of one or both of silicon dioxide and silicon nitride.

Sidewall spacers 120 can be formed by providing a layer of the material of the sidewall spacers over an upper surface of construction 10, and subsequently subjecting such layer to anisotropic etching.

Figure 19:
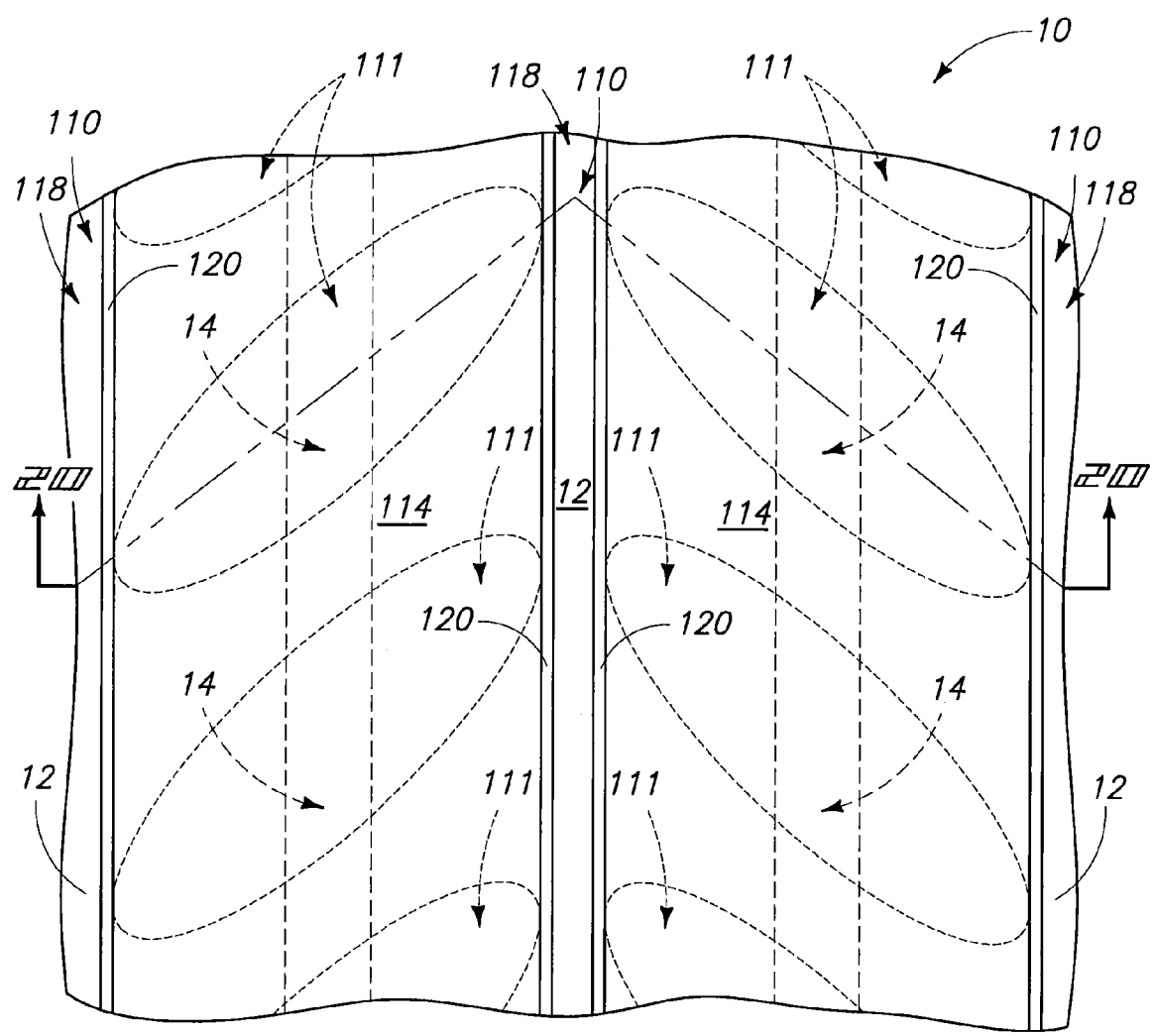
FIGS. 19 and 20 are views of the fragments of FIGS. 11 and 12, respectively, shown at a processing stage subsequent to that of FIGS. 17 and 18. The cross-section of FIG. 20 is along the line 20-20 of FIG. 19.
Figure 20:
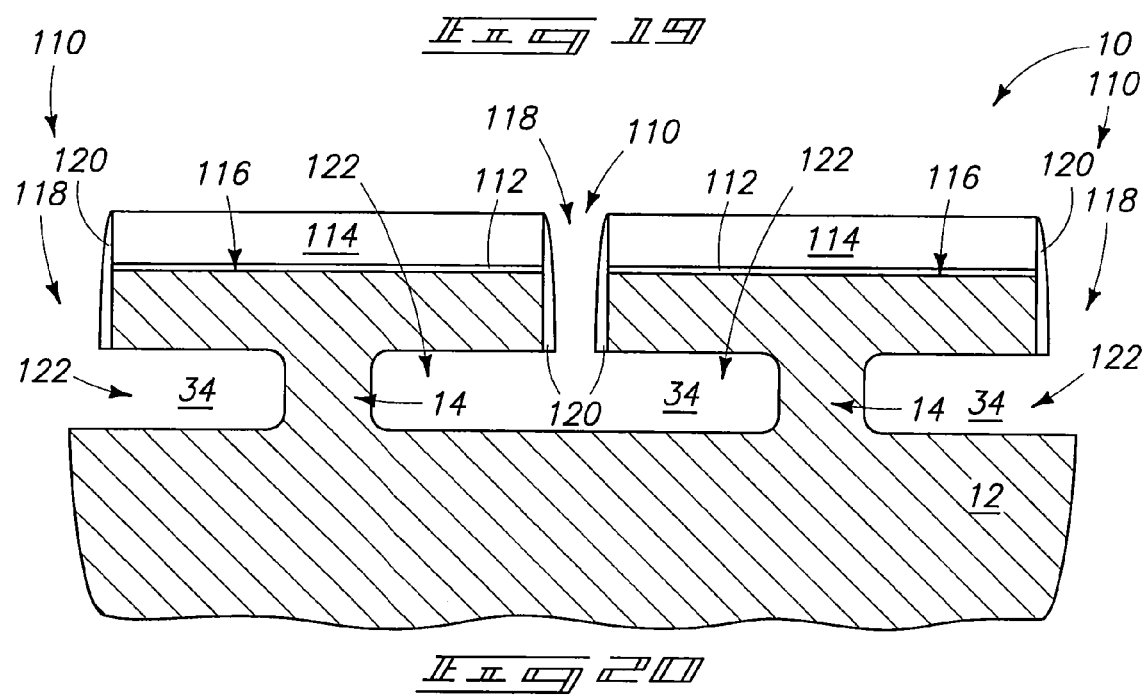

Referring next to FIGS. 19 and 20, semiconductor material 12 is subjected to an isotropic etch which removes material 12 from second regions 118, and which undercuts the first regions 116. Accordingly, the second etch forms openings 122 extending into second regions 118, and under first regions 116. Any suitable isotropic etch can be utilized for the processing of FIGS. 19 and 20, including, for example, various wet etches.

The formation of openings 122 forms the narrow mesas 14 of semiconductor material 12 which were shown and described above with reference to FIGS. 1-6. The narrow mesas 14 are shown in phantom in the top view of FIG. 19 to assist the reader in identifying the location of the mesas 14 relative to the active area locations 111.

Referring next to FIGS. 21 and 22, a patterned masking material 128 is formed over the active area locations 111. Masking material 128 can comprise, for example, photoresist; and can be formed into the shown pattern with photolithographic processing.

Referring next to FIGS. 23 and 24, the pattern of masking material 128 (FIGS. 21 and 22) is transferred into underlying materials 112 and 114 with one or more suitable etches, and masking material 128 (FIGS. 21 and 22) is removed. The layers 112 and 114 are thus patterned into shapes corresponding to desired shapes of the active area locations 111.

Figure 25:
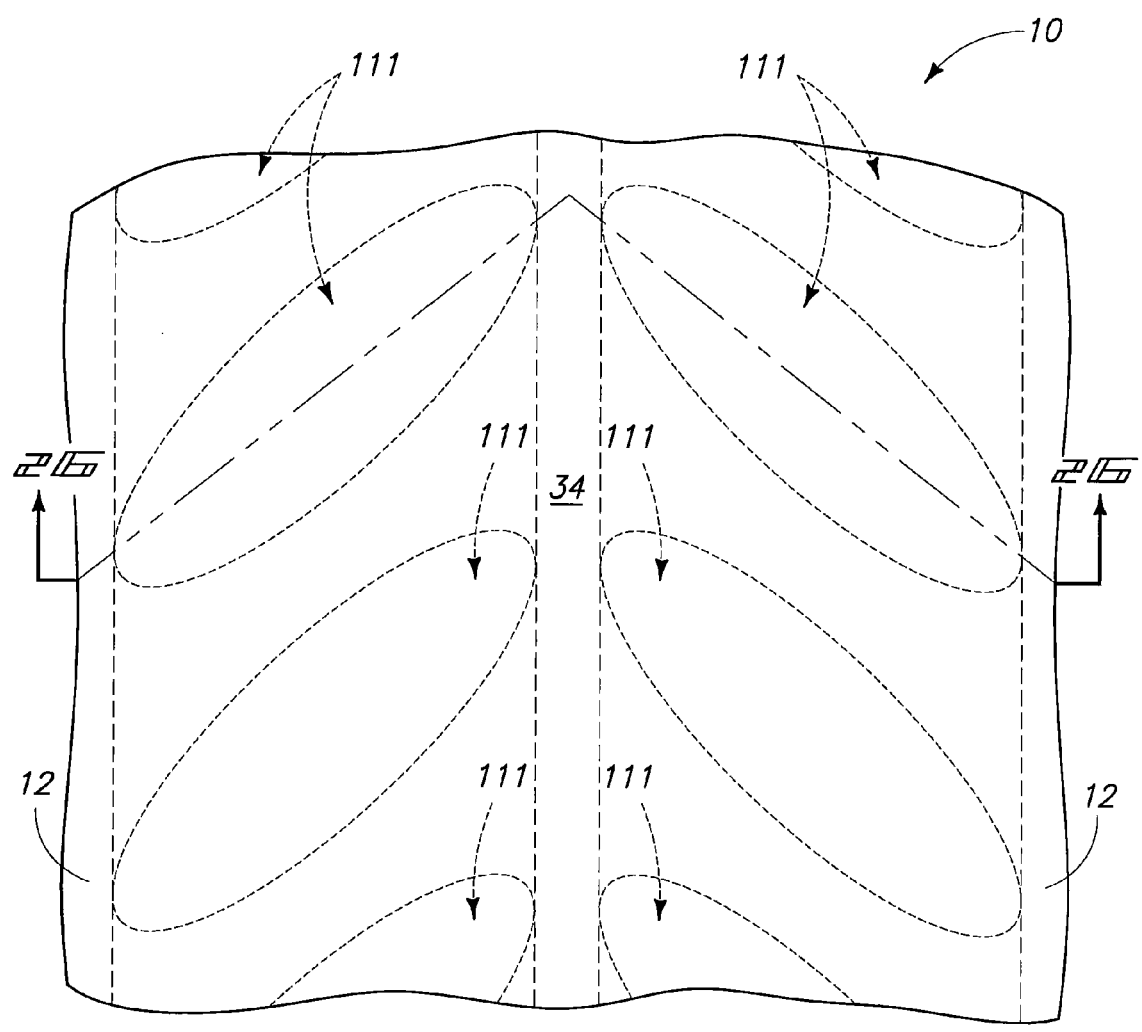
FIGS. 25 and 26 are views of the fragments of FIGS. 11 and 12, respectively, shown at a processing stage subsequent to that of FIGS. 23 and 24. The cross-section of FIG. 26 is along line 26-26 of FIG. 25.
Figure 26:
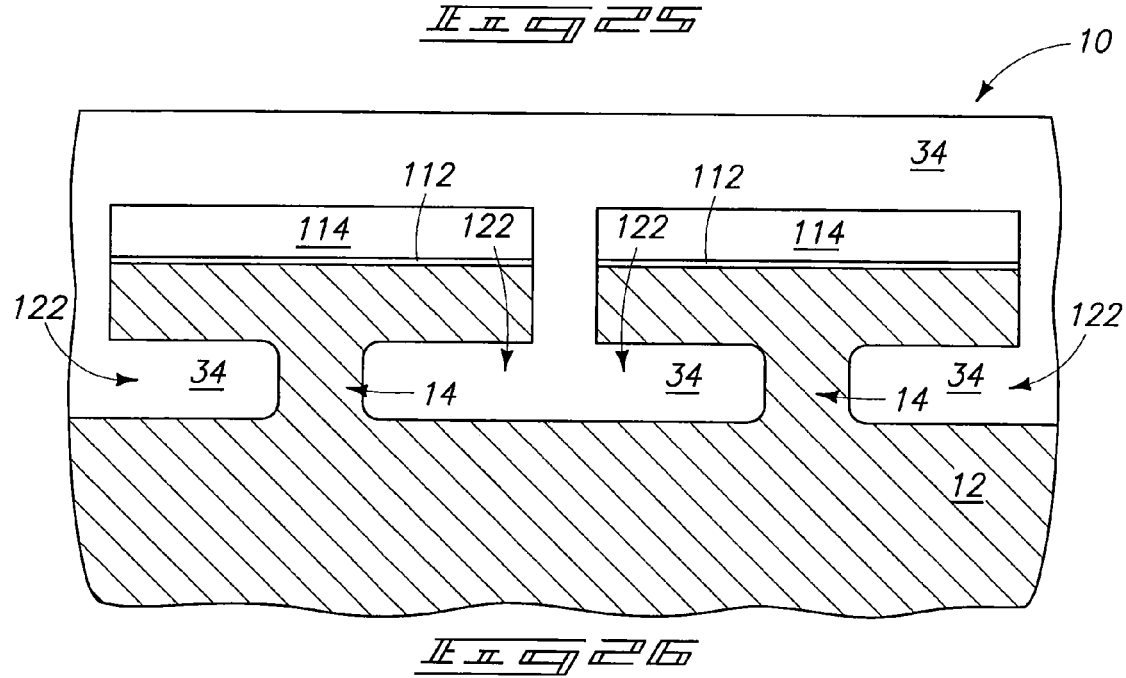

Referring next to FIGS. 25 and 26, openings 122 are filled with electrically insulative material 34. The spacers 120 (FIGS. 17 and 18) are shown removed prior to the filling of the openings with the insulative material 34. However, it is to be understood that if the spacers comprise the same composition as insulative material 34, the spacers can remain at the processing stage of FIGS. 25 and 26 and will merge with material 34 to form the shown construction. Also, even if the spacers comprise a different electrically insulative composition from material 34, the spacers can remain at the processing stage of FIGS. 25 and 26 if the composition of the spacers is compatible for incorporation into isolation regions ultimately formed across the locations of the spacers. The insulative material 34 is identical to that discussed above with reference to FIGS. 1-6.

Referring next to FIGS. 27 and 28, construction 10 is subjected to planarization (such as, for example, chemical-mechanical polishing) to form the shown planarized upper surface extending across insulative material 34 and semiconductor masking material layer 114. The remaining masking material layer 114 is shown to be patterned over the active area locations 111.

Referring next to FIGS. 29 and 30, a patterned mask 124 is formed over layer the 114 within the active area locations 111, and also over the insulative material 34 between the active area locations. The patterned mask has openings (specifically trenches) 136, 138, 140 and 142 extending therethrough. The patterned mask can, for example, comprise, consist essentially of, or consist of photolithographically patterned photoresist.

The openings 136, 138, 140 and 142 expose portions of insulative material 34, and expose portions of layer 114.

Referring next to FIGS. 31-33, openings 136, 138, 140 and 142 are extended into the insulative material 34 with a suitable etch. The etch also pulls back the exposed layer 114 within the trenches (typically silicon nitride) and etches any exposed layer 112 (typically silicon dioxide) to expose some of the silicon of the active area locations. Any suitable etch can be utilized with is less than 100% selective for silicon dioxide relative to silicon nitride. Typically the etch will not substantially remove exposed silicon of the active area locations. The selectivity of the etch and thickness of layer 114 can be adjusted to tailor the amount of layer 114 remaining within trenches 136, 138, 140 and 142 after the etch. In some aspects (not shown) the layers 112 and 114 can be patterned with a mask, in addition to or alternatively to, patterning the layers with a pull-back during the etch of material 34.

Figure 36:
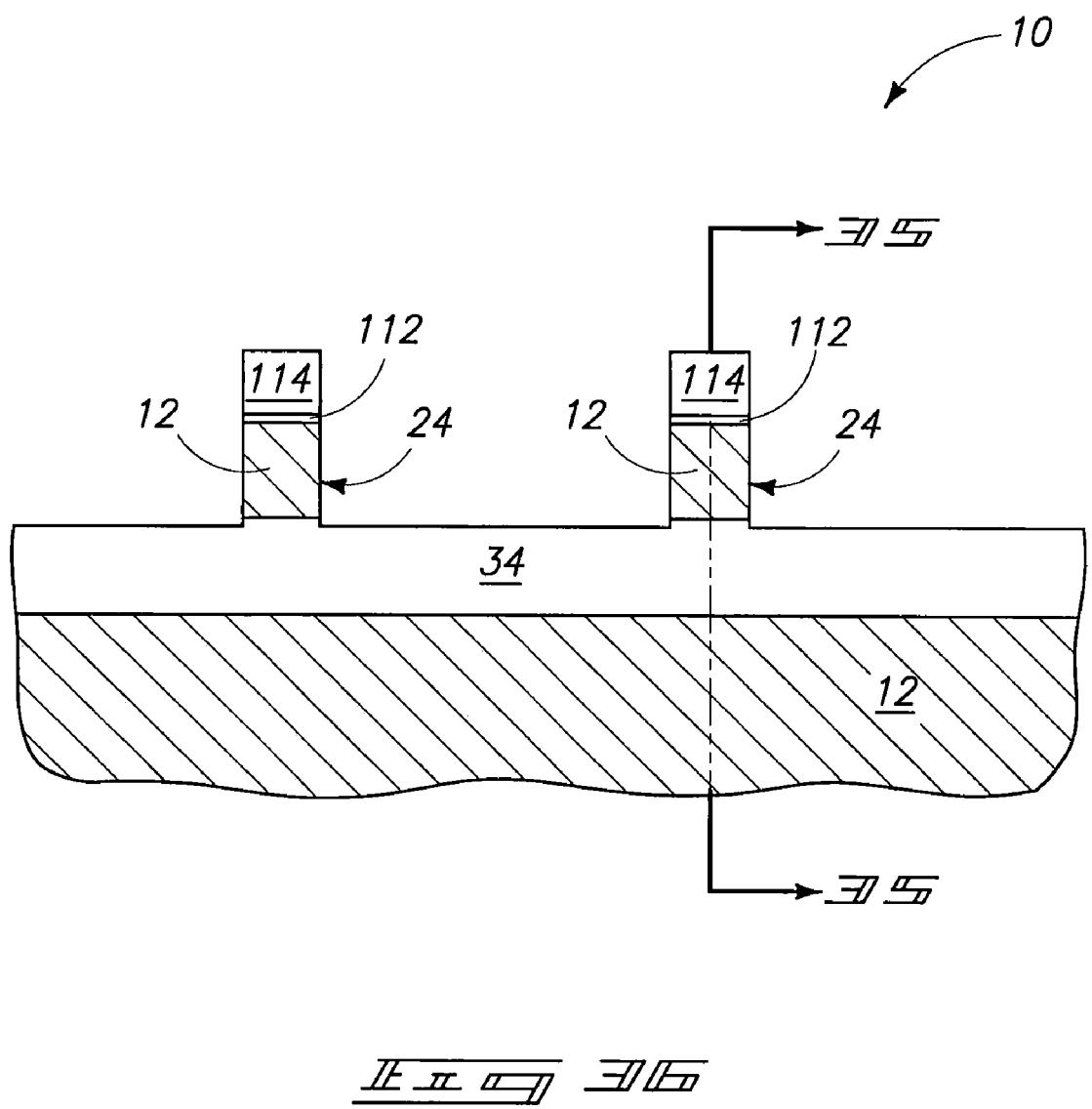
Figure 39:
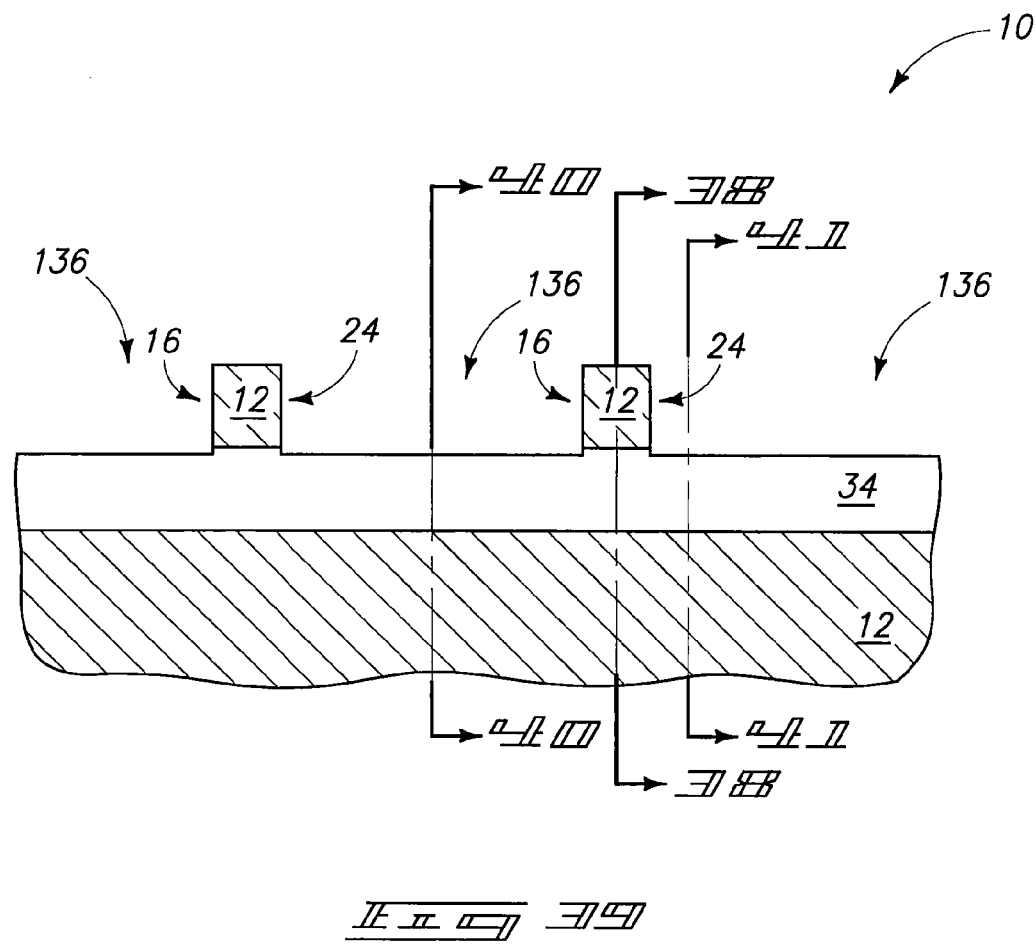
Figure 40:
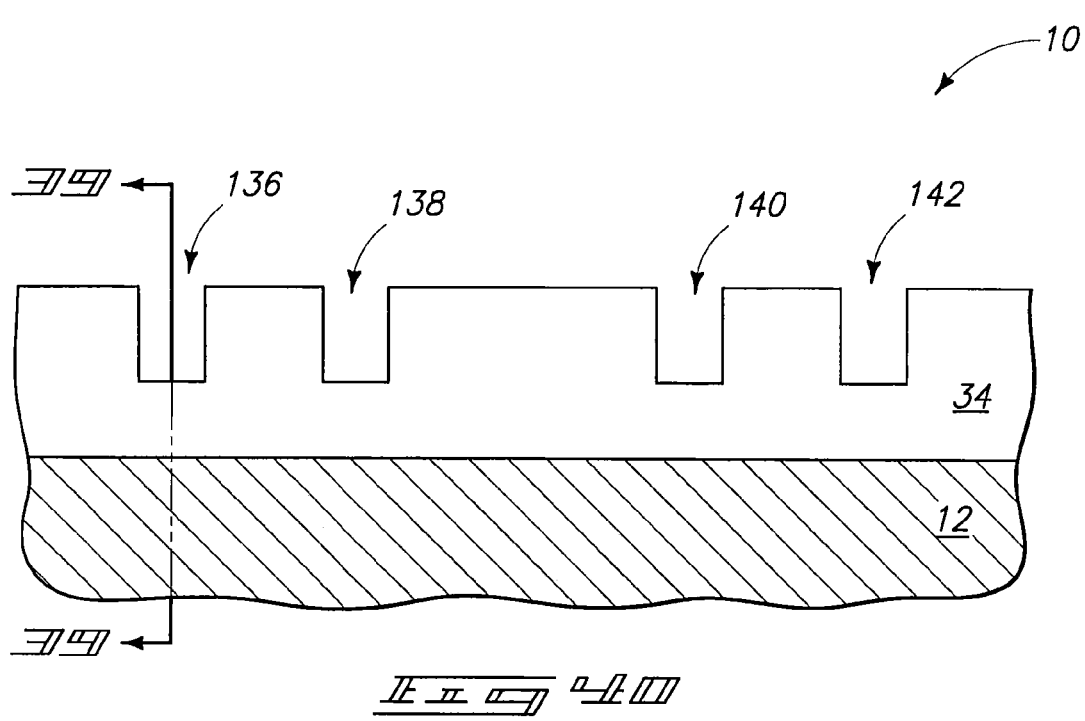
Figure 41:
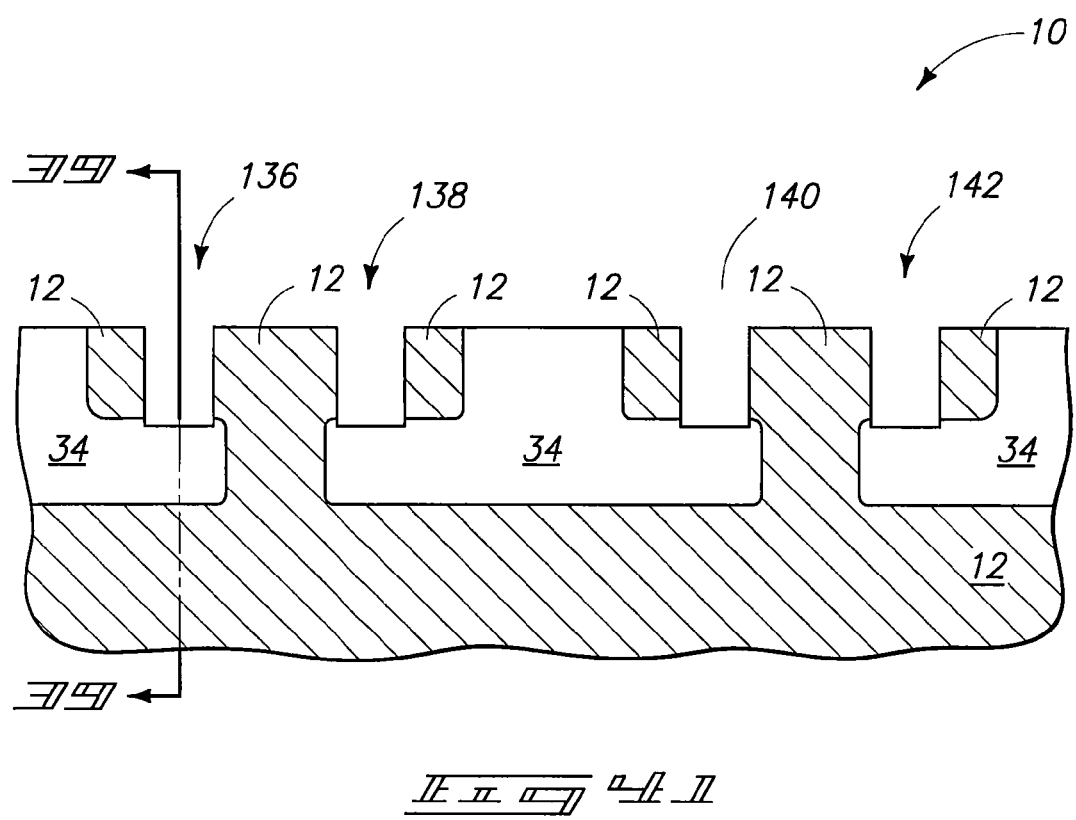

Referring next to FIGS. 34-36, exposed portions of semiconductor material 12 are removed from within trenches 136, 138, 140 and 142. After the removal of the exposed portions of the semiconductor material, the trenches can be considered to be formed extending across insulative material 34 and partially across caps 16 of the semiconductor material (with the caps 16 being of the type described with reference to FIGS. 1-6). Ridges 24 of semiconductor material 12 remain within central regions of the semiconductor material caps between the trenches; and such ridges are thus formed as a result of the formation of the trenches.

Referring next to FIGS. 37-41, materials 112 and 114 are removed to leave the shown structure comprising caps 16 of semiconductor material 12 at active area locations 111; and comprising ridges 24 within regions of the caps. The structure has remnants of trenches 136, 138, 140 and 142 extending into the insulative material 34 between the ridges 24.

Referring next to FIGS. 42 and 43, lines 36, 38, 40 and 42 are formed within trenches 136, 138, 140 and 142 (FIGS. 37-41); and also over ridges 24. The lines 36, 38, 40 and 42 comprise the gate dielectric material 44, conductive gateline material 46 and protective insulative material 48 described above with reference to FIGS. 1-6.

During the formation of the layers 44, 46 and 48, the dielectric material 44 can be initially formed within the trenches as liners within the trenches, and subsequently the layers 46 and 48 can be formed over the dielectric material. Alternatively, the dielectric material can be formed only along exposed regions of the semiconductor material 12 by thermally oxidizing the semiconductor material.

Threshold voltage implants can be provided within the channel regions at any suitable stage of the above-described processing; and the construction of FIGS. 42 and 43 can be subjected to subsequent processing to form spacers, source/drain regions, capacitors and bitlines of the types shown and described in FIGS. 1-6 to thereby complete a construction identical to that of FIGS. 1-6.

The processing of FIGS. 11-43 is exemplary processing, and it is to be understood that the invention also includes numerous variations of such processing. For instance, the trenches can be etched into the insulative material 34 to any suitable depth to form any of constructions described above with reference to FIGS. 1-10.

In some aspects of the invention, various of the constructions described with reference to FIGS. 1-43 can be incorporated into electronic systems. Exemplary systems are described with reference to FIGS. 44-47.

Figure 44:
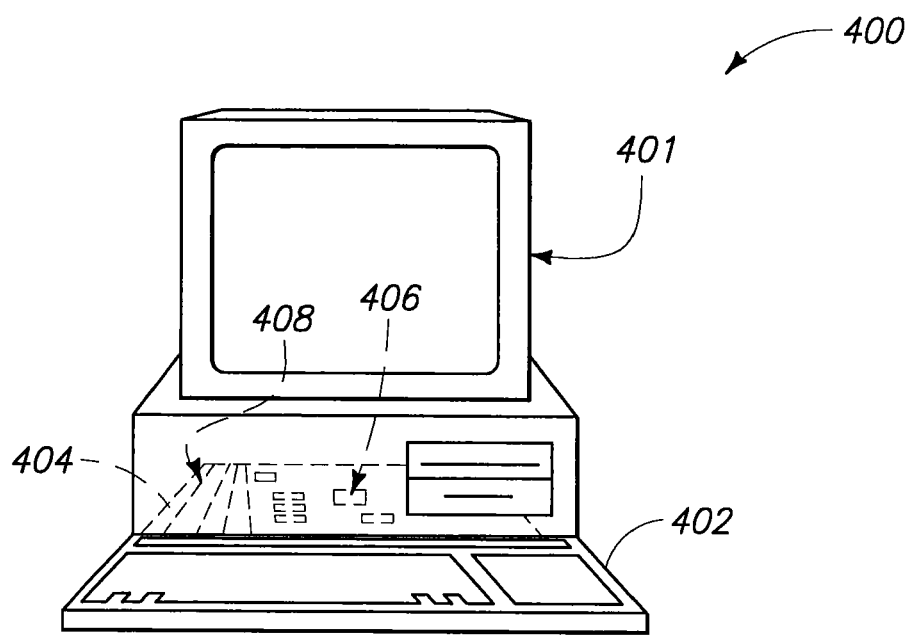
FIG. 44 is a diagrammatic view of a computer illustrating an exemplary application of the present invention.
Figure 45:
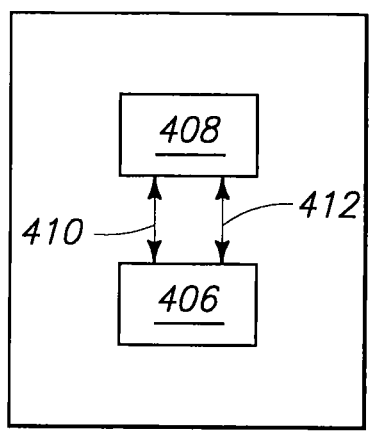
FIG. 45 is a block diagram showing particular features of the motherboard of the FIG. 44 computer.

FIG. 44 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 45. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 46:
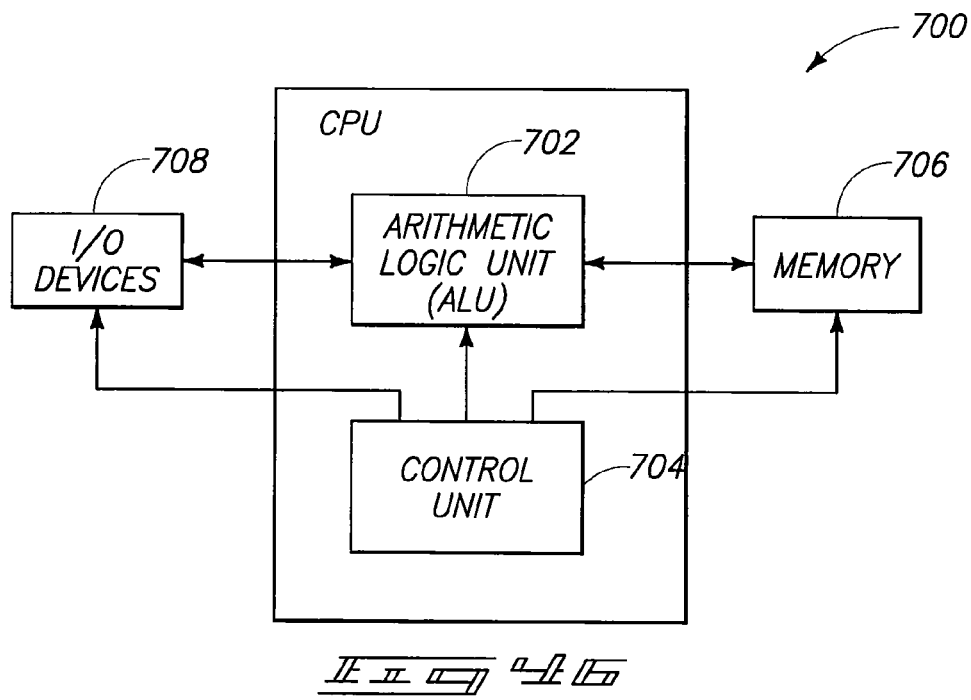
FIG. 46 is a high level block diagram of an electronic system according to an exemplary aspect of the present invention.

FIG. 46 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 47:
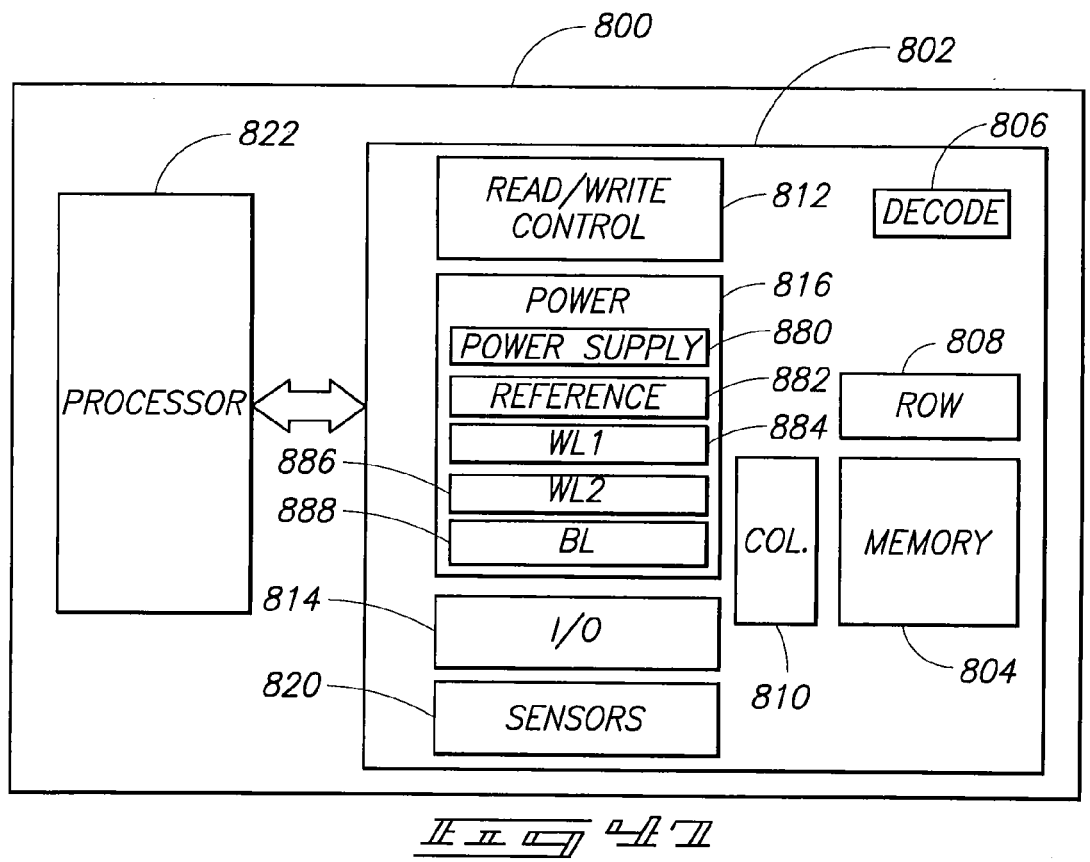
FIG. 47 is a simplified block diagram of an exemplary memory device according to an aspect of the present invention.

FIG. 47 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
a semiconductor substrate having a bulk semiconductor material with a thickness; a vertical direction being defined to extend through the thickness, and a horizontal direction being defined to extend orthogonally to the vertical direction;
a transistor supported by the substrate; the transistor comprising a gate containing electrically conductive gate material; a channel proximate the gate; and a pair of source/drain regions on opposing sides of the channel; the source/drain regions and channel together forming a segment that extends primarily horizontally; the transistor comprising a dielectric material between the gate material and the channel;
wherein the channel has a longitudinal axis from one of the source/drain regions to the other, and has a lateral periphery along a cross-section substantially orthogonal to the longitudinal axis; wherein the lateral periphery is a four-sided polygon;

wherein the four-sided polygon of the channel has a bottom surface, a top surface, and a pair of side surfaces extending from the bottom surface to the top surface;

wherein the dielectric material of the transistor is conformally along and directly against the top and side surfaces of the four-sided polygon of the channel, and extends under an entirety of the bottom surface, but is only directly against a portion of the bottom surface, and is not conformal to the bottom surface; the dielectric material from one side of the polygon contacting the dielectric material from the other side of the polygon under the bottom surface; and wherein the electrically conductive gate material of the transistor gate wraps around the lateral periphery of the channel and extends conformally along the dielectric material along the top and side surfaces of the four-sided polygon; the electrically conductive gate material of the transistor gate also extending to under the bottom surface of the four-sided polygon, and being under an entirety of the bottom surface except for a region where the dielectric material from one side of the polygon contacts the dielectric material from the other side of the polygon.

2. The construction of claim 1 wherein the substrate comprises a mesa of the semiconductor material extending upwardly along the vertical direction; and further comprising electrically insulative material surrounding the mesa; one of the source/drain regions being over the electrically insulative material and not directly over the mesa; and at least a portion of the other of the source/drain regions being directly over the mesa.

3. The construction of claim 2 further comprising:
a capacitor electrically coupled with said one of the source/drain regions; and
a bitline electrically coupled with said other of the source/drain regions.

4. The construction of claim 2 wherein the channel is over the electrically insulative material and not directly over the mesa.

5. The construction of claim 2 wherein the semiconductor material comprises silicon.

6. The construction of claim 2 wherein the semiconductor material consists essentially of silicon.

7. The construction of claim 1 wherein the transistor is a first transistor, the channel is a first channel, the gate is a first transistor gate; and the source/drain regions are a first source/drain region and a second source/drain region; further comprising a second transistor comprising a second transistor gate and a second channel proximate the second gate; wherein the first source/drain is shared between the first and second transistors; further comprising a third source/drain region on an opposing side of the second channel from the first source/drain region.

8. The construction of claim 7 further comprising:
a first capacitor electrically coupled with the second source/drain region;
a second capacitor electrically coupled with the third source/drain region; and
a bitline electrically coupled with the first source/drain region.

9. The construction of claim 7 wherein the second channel has a longitudinal axis which is parallel to the longitudinal axis of the first channel.

10. The construction of claim 9 wherein the longitudinal axis of the second channel is an extension of the longitudinal axis of the first channel.

* * * * *